(12) United States Patent
Hollars

(10) Patent No.: US 6,974,976 B2
(45) Date of Patent: Dec. 13, 2005

(54) THIN-FILM SOLAR CELLS

(75) Inventor: Dennis R. Hollars, San Jose, CA (US)

(73) Assignee: Miasole, San Jose, CA (US)

( * ) Notice: Subject to any disclaimer, the term of this patent is extended or adjusted under 35 U.S.C. 154(b) by 0 days.

(21) Appl. No.: 10/671,238

(22) Filed: Sep. 24, 2003

(65) Prior Publication Data

US 2004/0063320 A1 Apr. 1, 2004

Related U.S. Application Data

(60) Provisional application No. 60/435,814, filed on Dec. 19, 2002, and provisional application No. 60/415,009, filed on Sep. 30, 2002.

(51) Int. Cl.$^7$ ............................................. H01L 31/109
(52) U.S. Cl. ........................ 257/184; 257/461; 438/94; 438/95; 136/264; 136/265
(58) Field of Search ............................... 257/184, 461; 438/94–95; 136/264–265, 260

(56) References Cited

U.S. PATENT DOCUMENTS

| | | | |
|---|---|---|---|
| 4,298,444 A | 11/1981 | Chahroudi | |
| 4,318,938 A | 3/1982 | Barnett et al. | |
| 5,477,088 A | 12/1995 | Rockett et al. | ............. 257/764 |
| 5,571,749 A | 11/1996 | Matsuda et al. | |
| 5,626,688 A | * 5/1997 | Probst et al. | ................ 136/265 |
| 5,676,766 A | * 10/1997 | Probst et al. | ................ 136/265 |
| 5,986,204 A | 11/1999 | Iwasaki et al. | |
| 6,107,564 A | 8/2000 | Aguilera et al. | |
| 6,310,281 B1 | 10/2001 | Wendt et al. | |
| 6,365,010 B1 | 4/2002 | Hollars | |
| 6,372,538 B1 | 4/2002 | Wendt et al. | |
| 6,429,369 B1 | * 8/2002 | Tober et al. | ................ 136/265 |

OTHER PUBLICATIONS

Nishiwaki et al. "Preparation of Zn doped Cu(In,Ga)Se$_2$ thin films by physical vapor deposition for solar cells" International Search Report for corresponding PCT Application No. PCT/US03/30151 filed Sep. 24, 2003.
National Renewable Energy Laboratory, NREL/CP–520–22922—UC Category 1250, Ullal, et al, entitled "Current Status of Polycrystalline Thin–Film PV Technologies", Sep. 1997.

* cited by examiner

*Primary Examiner*—Dung A. Le
(74) *Attorney, Agent, or Firm*—DLA Piper Rudnick Gray Cary US LLP

(57) ABSTRACT

A method of manufacturing improved thin-film solar cells entirely by sputtering includes a high efficiency back contact/reflecting multi-layer containing at least one barrier layer consisting of a transition metal nitride. A copper indium gallium diselenide ($Cu(In_xGa_{1-x})Se_2$) absorber layer (X ranging from 1 to approximately 0.7) is co-sputtered from specially prepared electrically conductive targets using dual cylindrical rotary magnetron technology. The band gap of the absorber layer can be graded by varying the gallium content, and by replacing the gallium partially or totally with aluminum. Alternately the absorber layer is reactively sputtered from metal alloy targets in the presence of hydrogen selenide gas. RF sputtering is used to deposit a non-cadmium containing window layer of ZnS. The top transparent electrode is reactively sputtered aluminum doped ZnO. A unique modular vacuum roll-to-roll sputtering machine is described. The machine is adapted to incorporate dual cylindrical rotary magnetron technology to manufacture the improved solar cell material in a single pass.

12 Claims, 10 Drawing Sheets

THIN-FILM SOLAR CELLS

This application claims the benefit of U.S. Provisional Application No. 60/415,009, filed Sep. 30, 2002; and of U.S. Provisional Application No. 60/435,814, filed Dec. 19, 2002.

FIELD OF THE INVENTION

The invention disclosed herein relates generally to the field of photovoltaics, and more specifically to a unique high throughput roll-to-roll vacuum deposition system and method for the manufacturing of thin-film solar cells based upon absorbing layers that contain copper, indium, gallium, aluminum, and selenium and have a polycrystalline chalcopyrite structure.

BACKGROUND OF THE INVENTION

Interest in thin-film photovoltaics has expanded in recent years. This is due primarily to improvements in conversion efficiency of cells made at the laboratory scale, and the anticipation that manufacturing costs can be significantly reduced compared to the older and more expensive crystalline and polycrystalline silicon technology. The term "thin-film" is used to distinguish this type of solar cell from the more common silicon based cell, which uses a relatively thick silicon wafer. While single crystal silicon cells still hold the record for conversion efficiency at over 20%, thin-film cells have been produced which perform close to this level. Therefore, performance of the thin-film cells is no longer the major issue that limits their commercial use. The most important factor now driving the commercialization of thin-film solar cells is cost. Currently, a widely accepted technology solution for the scale up to low-cost manufacturing does not exist.

Attempts have been made and are now being made to remedy the problem, but progress has been slow. While a large infrastructure exists for the sputter coating of glass for the architectural window market, this process is not readily adapted to the production of solar cells for several reasons. First, the glass that is coated in large-scale machines is relatively thick compared to that used in solar modules. Also, the glass must be heated to temperatures far above that required in the window industry, causing large yield losses from fracturing and breakage. Handling large sheets of glass is expensive in terms of floor space and equipment, and the extra layers in a solar cell require additional large coating chambers with appropriate gas isolation between chambers. Finally, and maybe most importantly, efficient sputtering targets have not yet been made for the deposition of the absorber layer, which in many respects is the most challenging aspect of making a thin-film solar cell.

An early attempt to improve manufacturing of solar cells with a roll-to-roll technique was proposed by Barnett et al in U.S. Pat. No. 4,318,938 ('938) issued 9 Mar. 1982. They describe a roll-to-roll machine, which consists essentially of a series of individual batch processing chambers each adapted to the formation of a different layer. A thin foil substrate is continuously fed from a roll in a linear belt-like fashion through the series of individual chambers where it receives the required layers. Several of the layers are formed by evaporation of the desired material in vacuum chambers. The metal foil is transferred continuously from air to vacuum and back to air several times. The patent does not describe how this is accomplished, other than the statement that such technology can be purchased. Much has changed in recent years. The copper sulfide absorber layer proposed in '938 has been shown to be unstable in the field, and some of the other layers are no longer used. In particular, it is undesirable to have a pinch roller running on a newly formed coating layer. However, the inventors estimated that their continuous technique could reduce the manufacturing cost by as much as a factor of two over the conventional batch process for silicon. While a factor of two is still significant today, greater reductions in cost must be achieved if solar power is to become competitive with conventional sources of power generation.

Matsuda et al in U.S. Pat. No. 5,571,749 ('749) issued 5 Nov. 1996 teach a roll-to-roll coating system based on plasma chemical vapor deposition (CVD) techniques. Their system is a single linear vacuum chamber with a series of six gas gates for process isolation. The web substrate is passed through the machine in belt-like fashion similar to the method of '938, but the web remains in vacuum for the whole process. The solar cell absorbing layer is made from amorphous silicon deposited from the decomposition of silane gas. Different dopants are introduced along the belt path to create the required p-n junctions. Similar techniques are used at Uni-Solar of Troy, Mich. to make a variety of amorphous silicon solar cells. The conversion efficiency of amorphous silicon cells is inferior to that of the other thin film cells, and they suffer a loss of efficiency during the initial few weeks of exposure to solar radiation through a mechanism known as the Stabler-Wronski effect. Because of this the efficiencies of amorphous silicon remain well below that of other thin-film materials, and no one has yet found a way to mitigate the effect.

Wendt et al disclose a roll-to-roll system in U.S. Pat. No. 6,372,538 ('538) issued 16 Apr. 2002 that teaches a method for depositing a thin film solar cell based upon a copper indium/gallium diselenide (CIGS) absorber layer. The system is described as consisting of nine separate individual processing chambers in which a roll-to-roll process may be used at each chamber. Thus the overall system is similar to that described in '938, but without the continuous belt-like transport of the substrate through all of the chambers at once. Also the roll of thin material (polyimide in this case) is not continuously fed through a single vacuum system as it is in '749. Wendt et al teach conventional planar magnetron sputtering for the deposition of a molybdenum back contact layer onto the polyimide film. Adjustments are made to the argon gas pressure and some oxygen is introduced to adjust the film stress to accommodate the expansion of the polyimide when it is heated for the CIGS deposition. Incorporation of oxygen into the molybdenum layer increases its resistivity, requiring the layer to be thicker to provide adequate electrical conductivity. The CIGS materials are deposited over the molybdenum layer in a separate chamber using an array of thermal evaporators each depositing one of the components. The use of the polyimide substrate material presents at least two problems in processing. First, it contains a relatively large amount of adsorbed water, which is evolved in the vacuum system and can have negative effects on the process. And secondly, it cannot withstand the higher temperatures used for the deposition of high quality CIGS material. Thin foils of stainless steel would have neither of these problems. The preferred width of the polyimide web is 33 cm, and it runs at a typical line speed of 30 cm per minute. With respect to the present invention, such production rates (about a square foot per minute) are not considered large-scale; rather, rates 5 to 10 times faster with attendant cost reductions are necessary to make solar power competitive with power from conventional sources.

Copper indium diselenide ($CuInSe_2$ or CIS) and its higher band gap variants copper indium gallium diselenide (Cu(In/

Ga)Se$_2$ or CIGS), copper indium aluminum diselenide (Cu(In/Al)Se$_2$), and any of these compounds with sulfur replacing some of the selenium represent a group of materials that have desirable properties for use as the absorber layer in thin-film solar cells. The acronyms CIS and CIGS have been in common use in the literature for sometime. The aluminum bearing variants have no common acronym as yet, so CIGS is used here in an expanded sense to represent the entire group of CIS based alloys. To function as a solar absorber layer these materials must be p-type semiconductors. This is accomplished by establishing a slight deficiency in copper, while maintaining a chalcopyrite crystalline structure. Gallium usually replaces 20% to 30% of the normal indium content to raise the band gap; however, there are significant and useful variations outside of this range. If gallium is replaced by aluminum, smaller amounts of aluminum are required to achieve the same band gap.

CIGS thin-film solar cells are normally produced by first depositing a molybdenum (moly) base electrical contact layer onto a substrate such as glass, stainless steel foil, or other functional substrate material. A relatively thick layer of CIGS is then deposited on the moly layer by one of two widely used techniques. In the precursor technique, the metals (Cu/In/Ga) are first deposited onto the substrate using a physical vapor deposition (PVD) process (i.e. evaporation or sputtering), chemical bath, or electroplating process. Subsequently, a selenium bearing gas is reacted with the metals layer in a diffusion furnace at temperatures ranging up to about 600° C. to form the final CIGS composition. The most commonly used selenium bearing gas is hydrogen selenide, which is extremely toxic to humans and requires great care in its use. A second technique avoids the use of hydrogen selenide gas by co-evaporating all of the CIGS constituents onto a hot substrate from separate thermal evaporation sources. While the deposition rates are relatively high for thermal evaporation, the sources are difficult to control to achieve both the required stoichiometry and thickness uniformity over large areas of a substrate. Neither of these techniques for forming the CIGS layer is readily scalable to efficient large-scale production.

In part, moly is used as the back contact layer because of the high temperature required for the CIGS deposition. Other metals (silver, aluminum, copper etc.) tend to diffuse into and/or react with the selenium in the CIGS at the elevated deposition temperatures, and create an undesirable doping or interface between the contact layer and the CIGS layer. Moly has a very high melting point (2610 C), which helps to avoid this problem, although it will react with selenium at high temperatures. However, even if the reactive interface is minimized, moly still has a rather poor reflection at the interface with the CIGS layer, resulting in decreased efficiency since the light that penetrates the absorber initially is not reflected back through the CIGS effectively for a second chance at being absorbed. Therefore, replacing the moly with a better reflecting layer can allow a decrease in the thickness of the absorber layer as well as provide improved cell performance by moving the absorption events closer to the p-n junction.

The n-type material most often used with CIGS absorbers to form the thin "window" or "buffer" layer is cadmium sulfide (CdS). It is much thinner than the CIGS layer and is usually applied by chemical bath deposition (CBD). Cadmium is toxic and the chemical bath waste poses an environmental disposal problem, adding to the expense of manufacturing the cell. CBD zinc sulfide (ZnS) has been used successfully as a substitute for CdS, and has produced cells of comparable quality. The CBD method for ZnS is not as toxic as CdS; but, remains a relatively expensive and time-consuming process step, which should be avoided if possible. Radio frequency (RF) sputter deposition of CdS and ZnS has been demonstrated on a small scale. However, RF sputtering over large areas is difficult to control because the plasma is highly influenced by the chamber geometry in the conventional method of implementing RF sputtering. An improved method of RF sputtering ZnS is needed to reduce the process complexity as well as to eliminate the toxic cadmium from the process.

Finally, the window or buffer layer is covered with a relatively thick transparent electrically conducting oxide, which is also an n-type semiconductor. In the past zinc oxide (ZnO) has been used as an alternative to the traditional, but more expensive, indium tin oxide (ITO). Recently, aluminum doped ZnO has been shown to perform about as well as ITO, and it has become the material of choice in the industry. A thin "intrinsic" (meaning highly resistive) ZnO layer is often deposited on top of the buffer layer to cover any plating flaws in the CdS (hence "buffer" layer) before the cell is completed by the deposition of the transparent top conductive layer. In order to further optimize the performance of the cell, an antireflection coating may be applied as a final step. Because of differences in refractive index, this step is more important for silicon cells than for CIGS cells in which some level of antireflection is provided by the encapsulation material when the cells are made into modules. In the case of CIGS an antireflection coating may be applied to the outer surface of the glass.

The difficulties inherent in the deposition of CIGS related absorber layers as well as the buffer layer have prevented these thin-film solar cells from being readily manufactured in large scale with improved economies and lower costs. Concurrent improvements in the back reflector and elimination of cadmium and its waste disposal problems can also lower the cost per watt of generated solar power.

A conventional prior art CIGS solar cell structure is shown in FIG. 1. Because of the large range in the thickness of the different layers, they are depicted schematically. The materials most often used for each of the layers are also indicated in the figure. The arrow at the top of the figure shows the direction of the solar illumination on the cell. Element 1 is the substrate, and it is massive in relation to the thin-film layers that are deposited upon it. Glass is the substrate that has been commonly used in solar cell research; however, it is more likely that for large-scale production some type of foil-like substrate will be used. Layer 2 is the back electrical contact for the cell. Traditionally, it has been moly with a thickness of about 0.5 to 1.0 microns. While moly has been shown to be compatible with CIGS chemistry and the relatively high temperature of the CIGS deposition, it has some disadvantages. It is more expensive than other metals that are better conductors (aluminum or copper for example), and it is not a good reflector in the spectral region of the maximum solar output. Thus light that does not create electron-hole pairs in the CIGS absorber on its first transit is not efficiently reflected back through the absorber for a second chance at causing a photoelectric event. Light that is absorbed in the moly, including the part of the solar spectrum that falls outside of the CIGS absorption band, only contributes to heating of the cell, which lowers its overall conversion efficiency. A better back electrode material is desirable in a large-scale manufacturing system.

Layer 3 is the CIGS p-type semiconductor absorber layer. It is usually about 2 to 3 microns thick, but could be somewhat thinner and attain the same or improved efficiency if the reflection of the back electrode layer (2) were improved. It would be extremely desirable to produce this layer by magnetron sputtering. This would enable a large-scale manufacturing process because magnetrons can readily be made in large sizes, and thickness and composition control can be excellent. A major provision of this invention is to demonstrate how this can be done with CIGS materials. Layer 4 is the n-type semiconductor layer that completes the formation of the p-n junction. It is much thinner than the absorber layer (about 0.05 microns), and it should be highly transparent to the solar radiation. Traditionally, it has been called the window layer, since it lets the light pass down to the absorber layer. It is also referred to as a buffer layer because it seems to help protect the p-n junction from damage induced by the deposition of the next layer. So far the use of CdS has resulted in the highest efficiency cells for the CIGS type absorber materials. But CdS is environmentally toxic, and it is difficult to deposit uniformly in large-scale by either the chemical bath method or by conventional RF magnetron sputtering. In addition, CdS is not highly transparent to the green and blue region of the solar spectrum, which makes it less compatible with higher band gap absorber layers.

At the 26$^{th}$ IEEE Photovoltaic Specialists Conference in October of 1977 Ullal, Zweibel, and von Roedern suggested a list of fifteen non-cadmium containing n-type materials that might be used as substitutes for the CdS layer. Of those materials $SnO_2$, ZnO, $ZrO_2$, and doped ZnO, are readily deposited by ordinary reactive magnetron sputtering of the metal in an argon and oxygen atmosphere. The reactive sputtering method that uses dual cylindrical rotary magnetrons as taught in U.S. Pat. No. 6,365,010 ('010) is especially useful for depositing these oxide layers. However, the dual cylindrical rotary magnetron technology can easily be extended to the reactive sputtering of sulfides and selenides, if facility improvements are made to handle the delivery of small amounts of the hydrogen sulfide and hydrogen selenide gases to the reactive deposition region. Using this technique two of the other materials on the list, ZnS and ZnSe, can be readily deposited with the dual cylindrical rotary magnetron system in the reactive mode. ZnS deposited by other methods has already been used instead of CdS in a laboratory demonstration cell that achieved a conversion efficiency of 18%. In addition, both ZnS and ZnSe have larger band gaps than CdS, so they are more efficient window materials. The less desirable method of conventional RF sputtering would work marginally for depositing thin layers of any remaining materials that cannot be readily formed into conducting targets.

Layer 5 is the top transparent electrode, which completes the functioning cell. This layer needs to be both highly conductive and as transparent as possible to solar radiation. ZnO has been the traditional material used with CIGS, but indium tin oxide (ITO), Al doped ZnO, and a few other materials could perform as well. Layer 6 is the antireflection (AR) coating, which can allow a significant amount of extra light into the cell. Depending on the intended use of the cell, it might be deposited directly on the top conductor (as illustrated), or on a separate cover glass, or both. For space-based power it is desirable to eliminate the cover glass, which adds significantly to expensive launch weight. Ideally, the AR coating would reduce the reflection of the cell to very near zero over the spectral region that photoelectric absorption occurs, and at the same time increase the reflection in the other spectral regions to reduce heating. Simple AR coatings do not adequately cover the relatively broad spectral absorption region of a solar cell, so multiple layer designs that are more expensive must be used to do the job more efficiently. Coatings that both perform the AR function and increase the reflection of unwanted radiation require even more layers and significant coating system sophistication. Aguilera et al in U.S. Pat. No. 6,107,564 issued 22 Aug. 2000 thoroughly review the prior art, and offer some improved AR coating designs for solar cell covers.

As previously mentioned the moly back contact layer is not a good reflector, nevertheless it has become the standard for thin-film type solar cells. Finding a better reflecting material that would otherwise withstand the processing conditions could improve the cell performance. The task is not simple. The back layer simultaneously should be a good conductor, be able to withstand high processing temperatures, and it should be a good reflector. Many metals in the periodic table meet at least one of these requirements, and any metal could be made thick enough to provide enough conductivity to function as the back electrical contact. The requirement of high processing temperatures eliminates the low melting point metals from consideration. Metals like tin, lead, indium, zinc, bismuth, and a few others melt at temperatures below the processing temperature for the CIGS or most other solar absorber materials. The motivation to lower the cost of the cell excludes metals like gold, platinum, palladium, rhodium, ruthenium, iridium, and osmium which otherwise have good conduction and reasonable reflection properties. With the exception of magnesium, which is highly reactive, all of the rest of the metals on the left half of the periodic chart of the elements are relatively poor reflectors, including molybdenum. The remaining candidates include aluminum, copper, silver, and nickel, and only nickel (and to a lesser extent molybdenum) resists forming insulating and poorly reflecting selenium compounds at the CIGS interface. However, nickel will severely degrade CIGS material if it is allowed to diffuse into it.

It is desirable to improve the large-scale manufacturability of thin-film solar cells in order to reduce their cost and make them competitive with conventional sources of electrical power generation. The use of the term large-scale in the context of the present invention implies the coating of either discrete substrates or continuous webs that have width dimensions of about a meter or more. This invention provides an apparatus and a method for sputter depositing all of the layers in the solar cell, and particularly the CIGS layer, which greatly increases the deposition area over which the required properties of the material can be achieved and controlled. It also provides improvements to the back contact/reflecting layer and the elimination of cadmium from the process.

SUMMARY OF THE INVENTION

An approach to solving problems with conventional CIGS solar cells is presented by Iwasaki et al in U.S. Pat. No. 5,986,204 ('204). They consider the same list of candidate metals that were just discussed above; however, they propose using alloys of silver-aluminum and copper-aluminum for the back conductor. A limitation to use of these alloys is that they must be applied at relatively low process temperatures, below about 120 C, which are marginally appropriate for amorphous silicon absorber layers, but would not work for CIGS at its normal processing temperatures. In addition the patent teaches the use of a clear conducting oxide (ZnO) as a barrier layer between the alloy and the absorber layer, as well as placing the alloy on a textured base metal layer to increase the scattering angle. The ZnO layer provides conductivity and inhibits migration, but like all useful clear conducting oxides, it is an n-type semiconductor. When it is placed against the p-type absorber layer, a weak p-n junction is formed, which acts to apply an undesirable small reverse electrical bias to the cell. The primary p-n junction must then overcome this back bias to cause useful current to flow, thus degrading the net efficiency.

Iwasaki et al are on the right track, but there are two impediments to the performance of their reflector. First, the ZnO barrier layer should not be an n-type semiconductor; and secondly, alloys generally have poorer conductivity and reflectivity than the pure metals. Among the transition metal nitrides, borides, silicides, and carbides, several have high electrical conductivity; and additionally, they have high melting temperatures and are relatively inert. A few have desirable optical properties. The most optimum materials are the nitrides of some of the transition metals, and in particular titanium nitride (TiN), zirconium nitride (ZrN), and hafnium nitride (HfN). These nitrides have high melting points (about 3000 C for ZrN) and higher electrical conductivity than their parent metals; therefore, they do not act as semiconductors. Additionally, they have good optical properties; specifically, low indices of refraction similar to the noble metals. These properties make them very useful for forming an improved back contact/reflecting layer in solar cells. All of the above mentioned nitrides work well, but zirconium nitride has somewhat better optical and electrical properties, and it is the one discussed herein as representative of the entire class of metal nitrides.

FIG. 2 shows the computed reflectivity in air of 0.5 micron thick (opaque) films of molybdenum, niobium, nickel, copper, silver, aluminum, and zirconium nitride from 400 to 1200 nm. This spectral range covers the principal region of the solar radiant output, which lies above a photon energy of about 1 electron volt (ev). For a single junction solar cell a band gap of 1.4 to 1.5 ev is the optimum for highest efficiency, and in this region niobium and molybdenum, have reflection that is inferior to that of any of the other metals. The metallic nature of zirconium nitride is evidenced by its relatively high reflectivity as compared to molybdenum, niobium, and nickel. The reflectivity of a metal in air depends upon the optical indices of the air and the metal, which of course vary with wavelength. The simple formula for the reflection at the air/metal interface is:

$$R = \frac{(n_m - n_o)^2 + k_m^2}{(n_m + n_o)^2 + k_m^2}$$

where $n_o$ is the refractive index of air (~1) and $n_m$ and $k_m$ are the refractive index and extinction coefficient of the metal. For a metal like silver the refractive index is much smaller than one, and the extinction coefficient is larger than one, so the $k_m^2$ term dominates and the reflection approaches 100% for thick films. In the case of molybdenum, niobium, and nickel both n and k are greater than one in the visible spectral region, so their reflections work out to be substantially less because of the $(n_m-\backslash+n_o)^2$ terms.

It happens that most semiconductors also have a refractive index of about 3, and this is particularly true for CIGS and CdTe, two of the leading contenders for thin-film solar cell absorbers. The formula for the reflection suggests that the back reflection layer should not have n and k values near to 3. It seems that few if any in the industry have noticed or discussed this potential problem with molybdenum in particular. FIG. 3 shows the computed reflection of these metals at the interface between the CIGS layer and the metal back conducting and reflecting layer, which is the way the layer actually functions in the solar cell. Note that, as suggested above, the reflection of the molybdenum is greatly reduced from its value in air—by more than a factor of 2 in the most critical spectral regions. The reflections of niobium and nickel fair somewhat better, but are also reduced significantly. The reflections of the other metals are not reduced as much because their refractive indices differ more markedly from the value 3. Nickel is a better reflector than molybdenum, and it would be more economical; however, its tendency to diffuse is a potential problem, and since it is magnetic, it is more difficult to sputter than non-magnetic metals. Zirconium nitride would be an excellent solution, with much better reflection than molybdenum, niobium, or nickel. However, the zirconium nitride would need to be about 1.5 microns thick to provide the same total electrical conductivity as 0.5 microns of molybdenum. It is possible to manufacture such a thick film with some economy using reactive sputtering; however, there is a better solution.

FIG. 4 shows the reflection of the metals in the previous two figures when a 15 nm thick barrier layer of zirconium nitride is placed between the CIGS layer (or a CdTe layer) and the metal layer. The reflection of the molybdenum, niobium, and nickel are significantly improved, while the reflections of the other metals are slightly reduced. As the thickness of the zirconium nitride layer is further increased, the reflectance at the interface for all of the metals approaches that of the thick zirconium nitride shown in FIG. 7 (over 70%). In fact calculations predict that, at a zirconium nitride barrier layer thickness of approximately 100 nm (or 0.10 microns), the metal layer underneath the zirconium nitride has little to no effect on the reflectance of light back through the CIGS layer—it becomes totally dominated by the properties of the zirconium nitride barrier layer.

As an example FIG. 5 shows the reflection at a wavelength of 800 nm for molybdenum and silver at the absorber/reflector interface as the thickness of the zirconium nitride layer varies from zero to 200 nm. For molybdenum the reflection first increases sharply as the thickness of the zirconium nitride barrier layer increases, but it begins to roll off at a thickness of about 30 nm and changes very slowly after a thickness of about 60 nm. At a thickness of 100 nm further change in the reflection is imperceptible. Reflection results for niobium and nickel (not shown) behave in a manner very similar to molybdenum. The reflections start at a higher level than molybdenum, but they quickly approach the same limit. For silver the reflection starts out at high reflection (about 95%) and falls to that of thick zirconium nitride over about the same thickness range as the case for molybdenum. In general metals that are poor reflectors need thicker zirconium nitride barrier layers, and metals that are very good reflectors should have thinner barrier layers, i.e. just enough to do the job of protecting the absorber/reflector interface. So a thin layer of ZrN acts like a metal and prevents the formation of an inverse p-n junction. It improves the reflection of the optically poor metals, and protects the CIGS layer from diffusion by the highly reflective metals. Since the optical properties are separated from the conductivity requirements of the back contact layer, a wider range of choices for the base metal layer are possible.

Accordingly, the present invention relates to a roll-to-roll deposition apparatus and method for producing an all sputtered thin-film CIGS solar cell, wherein the CIGS absorber layer is formed by co-deposition from a pair of rectangular planar or cylindrical rotary magnetrons using direct current (DC) sputtering. The buffer layer of ZnS is RF sputtered from a conventional planar magnetron housed in a special chamber, thus replacing the toxic CdS with a more benign material. The remaining layers in the cell are formed by deposition from dual magnetrons utilizing DC and alternating current (AC) sputtering. Thus the cell is manufactured in a single pass through a large modular vacuum deposition machine with no wet processes or high temperature gas diffusion processes involved. The back contact/reflecting layer is improved by the addition of a material not used in solar cells previously. In a preferred embodiment of the invention, the CIGS layer is deposited from dual cylindrical rotary magnetrons, used in the configuration that is described in U.S. Pat. No. 6,365,010 (which is incorporated herein by reference), in which one target contains copper and selenium while the second target contains indium, gallium, and selenium or indium, aluminum, and selenium.

A primary objective of the present invention is to provide a large-scale manufacturing system for the economical production of thin-film CIGS solar cells.

An additional objective of the invention is to provide a manufacturing protocol for solar cells in which high temperature toxic gases and toxic wet chemical baths are eliminated from the process.

Another objective of the invention is to provide a manufacturing process for CIGS solar cells, which significantly lowers their cost, specifically by improvements in the back contact/reflection layer and the elimination of cadmium and the disposal of its toxic wastes.

A further objective of the invention is to provide an apparatus and manufacturing process for CIGS solar cells, which significantly increases the size of substrate that can be used, including primarily continuous webs of material deposited in a special customized and modularized roll-to-roll coating machine with increased capabilities and efficiencies.

The present invention is a method of manufacturing a solar cell that includes providing a substrate, depositing a conductive film on a surface of the substrate wherein the conductive film includes a plurality of discrete layers of conductive materials, depositing at least one p-type semiconductor absorber layer on the conductive film, wherein the p-type semiconductor absorber layer includes a copper indium diselenide (CIS) based alloy material, depositing an n-type semiconductor layer on the p-type semiconductor absorber layer to form a p-n junction, and depositing a transparent electrically conductive top contact layer on the n-type semiconductor layer.

In another aspect of the present invention, a method of manufacturing a solar cell includes providing a substrate, depositing a conductive film on a surface of the substrate, depositing at least one p-type semiconductor absorber layer on the conductive film wherein the p-type semiconductor absorber layer includes a copper indium diselenide (CIS) based alloy material, and wherein the deposition of the p-type semiconductor absorber layer includes co-sputtering the CIS material from a pair of conductive targets, depositing an n-type semiconductor layer on the p-type semiconductor absorber layer to form a p-n junction, and depositing a transparent electrically conductive top contact layer on the n-type semiconductor layer.

In yet another aspect of the present invention, a method of manufacturing a solar cell includes providing a substrate, depositing a conductive film on a surface of the substrate, depositing at least one p-type semiconductor absorber layer on the conductive film wherein the p-type semiconductor absorber layer includes a copper indium diselenide (CIS) based alloy material and wherein the deposition of the p-type semiconductor absorber layer includes reactively AC sputtering material from a pair of identical conductive targets in a sputtering atmosphere comprising argon gas and hydrogen selenide gas, depositing an n-type semiconductor layer on the p-type semiconductor absorber layer to form a p-n junction, and depositing a transparent electrically conductive top contact layer on the n-type semiconductor layer.

In yet one more aspect of the present invention, a solar cell includes a substrate, a conductive film disposed on a surface of the substrate wherein the conductive film includes a plurality of discrete layers of conductive materials, at least one p-type semiconductor absorber layer disposed on the conductive film wherein the p-type semiconductor absorber layer includes a copper indium diselenide (CIS) based alloy material, an n-type semiconductor layer disposed on the p-type semiconductor absorber layer wherein the p-type semiconductor absorber layer and the n-type semiconductor layer form a p-n junction, and a transparent electrically conductive top contact layer on the n-type semiconductor layer.

In still yet one more aspect of the present invention, a vacuum sputtering apparatus includes an input module for paying out substrate material from a roll of the substrate material, at least one process module for receiving the substrate material from the input module, and an output module. The process module includes a rotatable coating drum around which the substrate material extends, a heater array for heating the coating drum, and one or more sputtering magnetrons each having a magnetron housing and a plurality of conductive sputtering targets disposed in the magnetron housing and facing the coating drum for sputtering material onto the substrate material. The output module receives the substrate material from the process module.

Other objects and features of the present invention will become apparent by a review of the specification, claims and appended figures.

DESCRIPTION OF THE PREFERRED EMBODIMENTS

The invention will now be described and compared with respect to the conventional prior art CIGS solar cell structure. The new cell structure and the manufacturing process will be detailed in relation to a modular roll-to-roll sputter deposition system designed specifically to provide an optimum implementation of the process.

It should be noted that, as used herein, the terms "over" and "on" both inclusively include "directly on" (no intermediate materials, elements or space disposed therebetween) and "indirectly on" (intermediate materials, elements or space disposed therebetween). For example, forming an element "on a substrate" can include forming the element directly on the substrate with no intermediate materials/elements therebetween, as well as forming the element indirectly on the substrate with one or more intermediate materials/elements therebetween.

Figure 1:
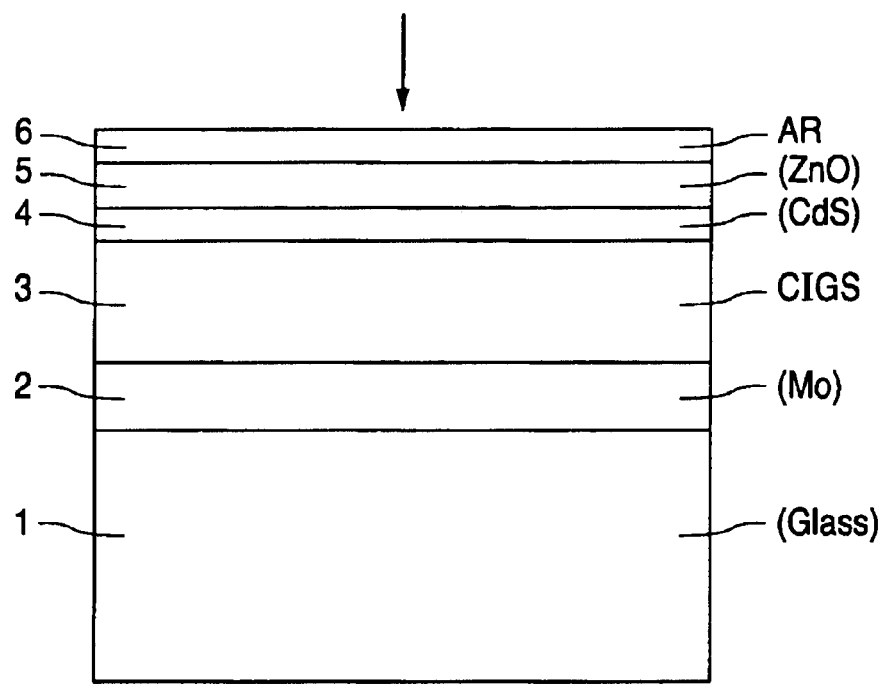
FIG. 1 is a schematic illustration of the prior art structure of a basic CIGS solar cell.
Figure 6:
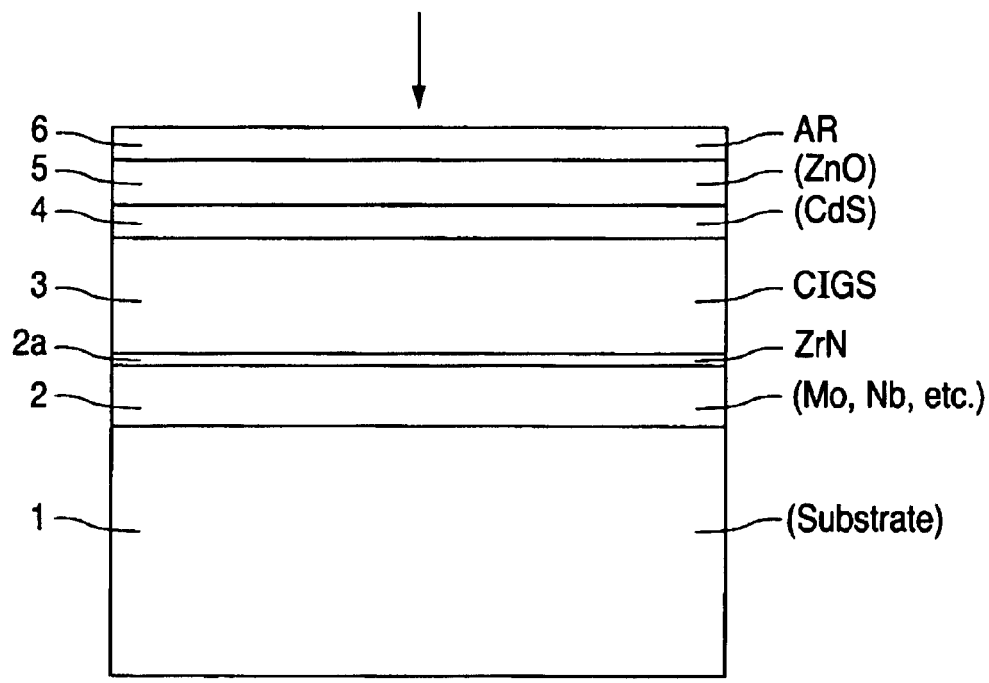
FIG. 6 shows the structure of the basic solar cell of the present invention, wherein a thin zirconium nitride is inserted between the CIGS layer and the back conducting/reflecting metal layer.
Figure 2:
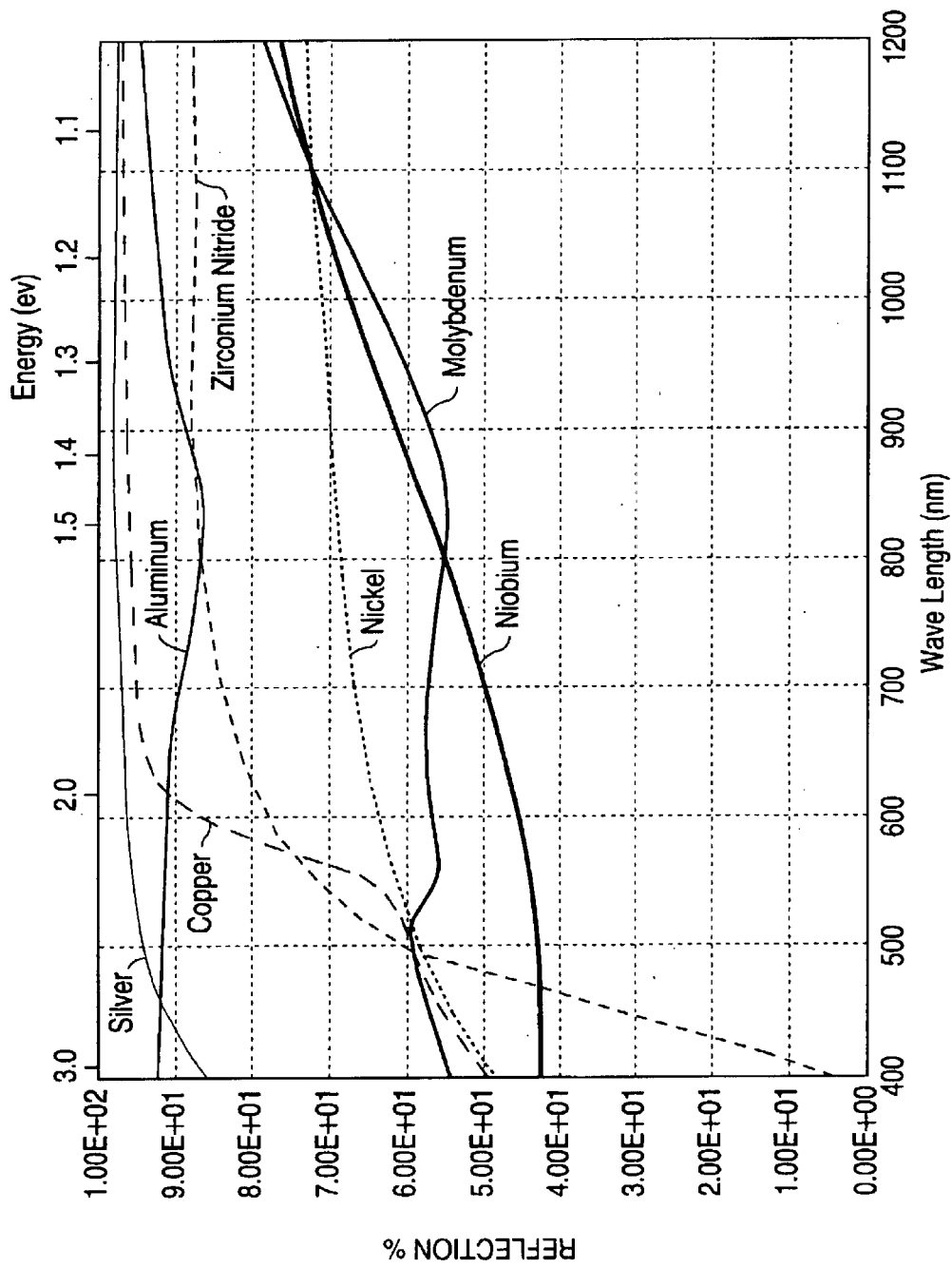
FIG. 2 shows the computed reflection in air of metals commonly considered useful as solar cell back contact layers. Included is a new class of materials represented by zirconium nitride.
Figure 3:
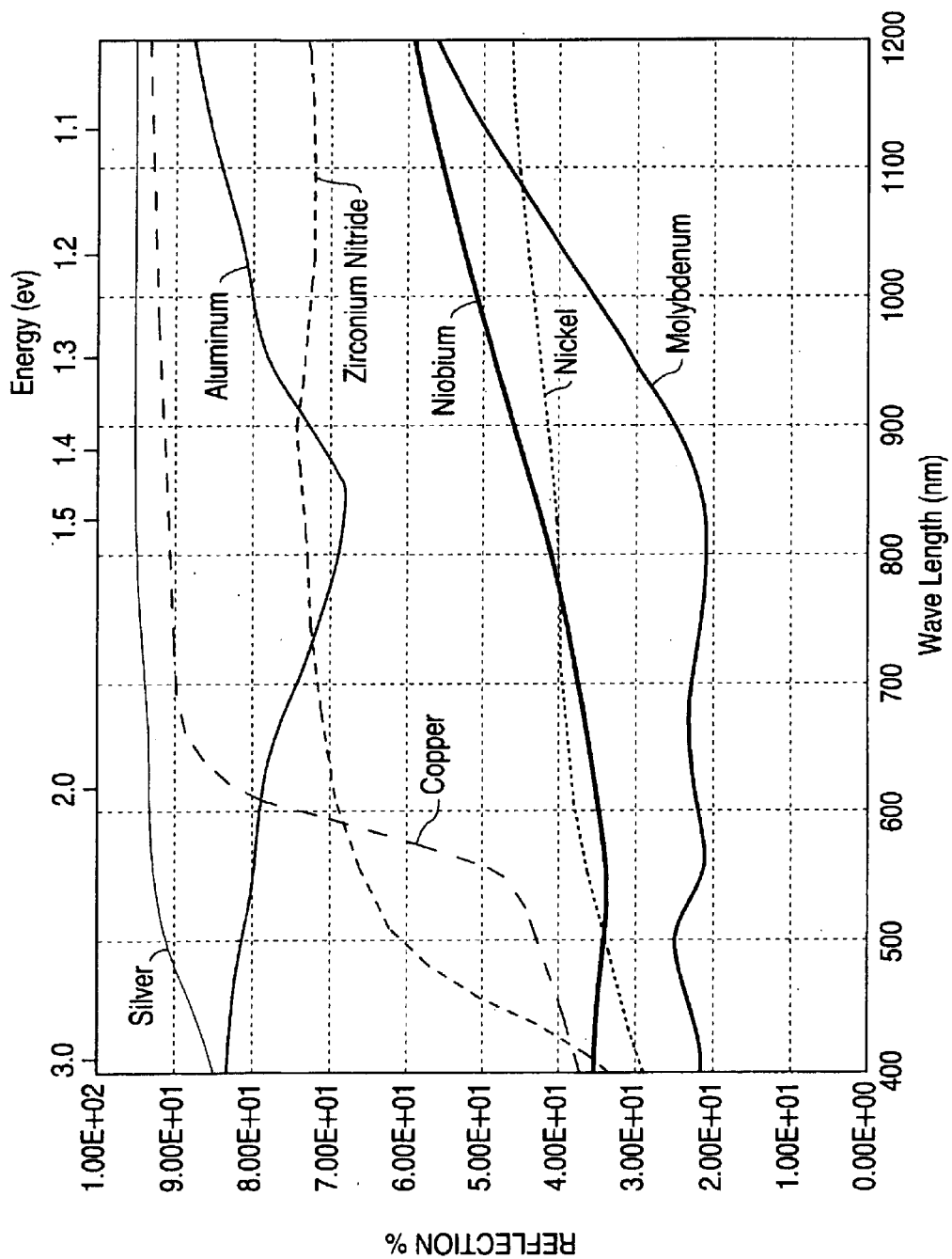
FIG. 3 shows the computed internal reflection at the interface between a CIGS absorber layer and the metals and zirconium nitride shown in FIG. 2.

FIG. 6 illustrates one of the simplest embodiments of a basic solar cell according to the present invention, which includes a zirconium nitride barrier layer. The figure is similar to the conventional solar cell shown in FIG. 1 except for the added barrier layer 2a of zirconium nitride between the CIGS layer 3 and electrical contact layer 2. As suggested above, electrical contact layer 2 can now be any of the metals that were discussed above or any economical metal with adequate conductivity. The alloys claimed by Iwasaki et al in '204 will work since the zirconium nitride barrier layer will block diffusion while retaining good reflectivity. Pure silver would give the optimum in performance; however, it would be a relatively expensive solution. Aluminum is the cheapest good reflector, but its melting point is relatively low (660 C) compared to the other metals, and it getters oxygen from the background water vapor in a vacuum system, which lowers its conductivity.

Figure 4:
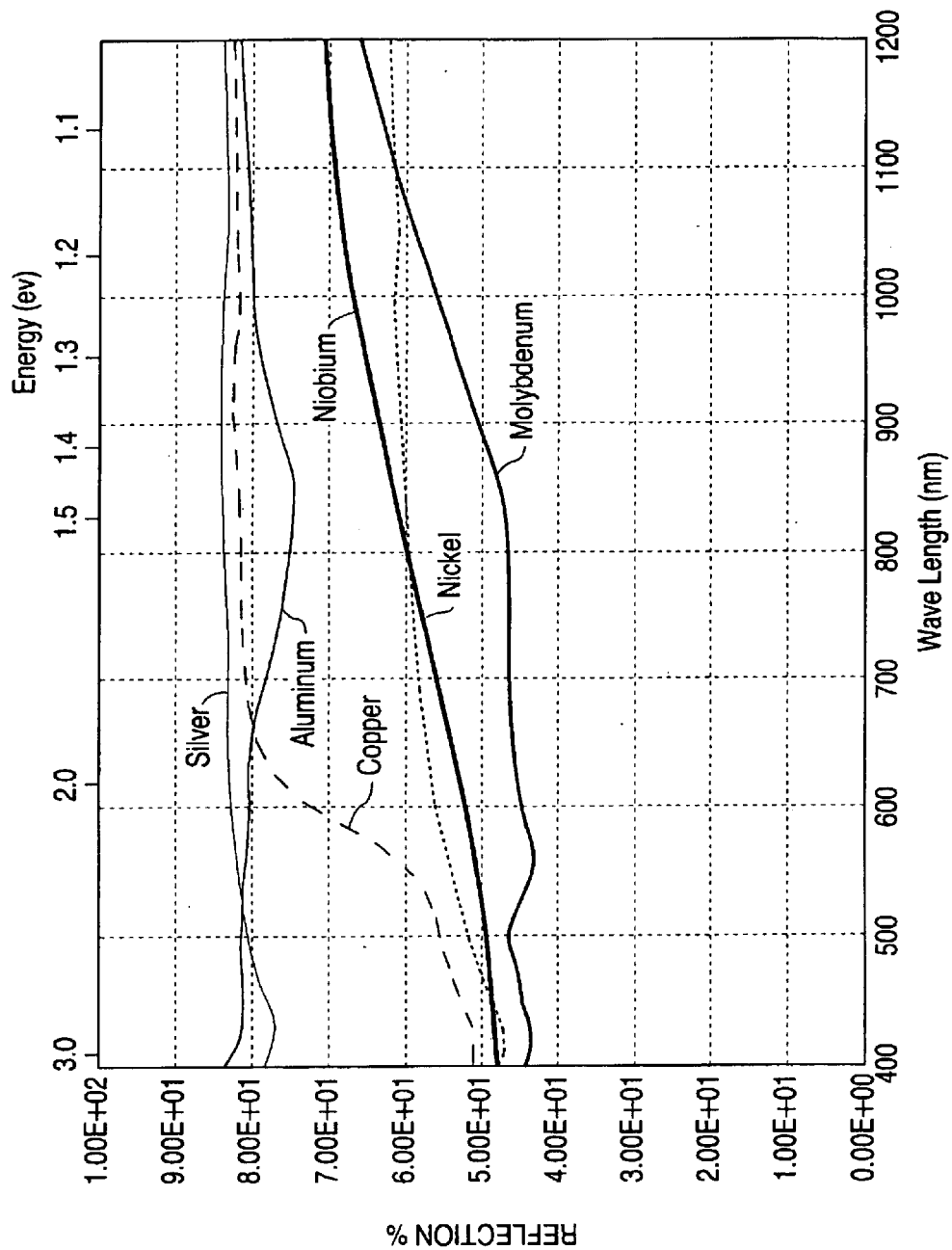
FIG. 4 shows the computed internal reflection at the interface between a CIGS absorber layer and the metals shown in FIG. 2 with a 15 nm thick layer of zirconium nitride placed at the interface.
Figure 5:
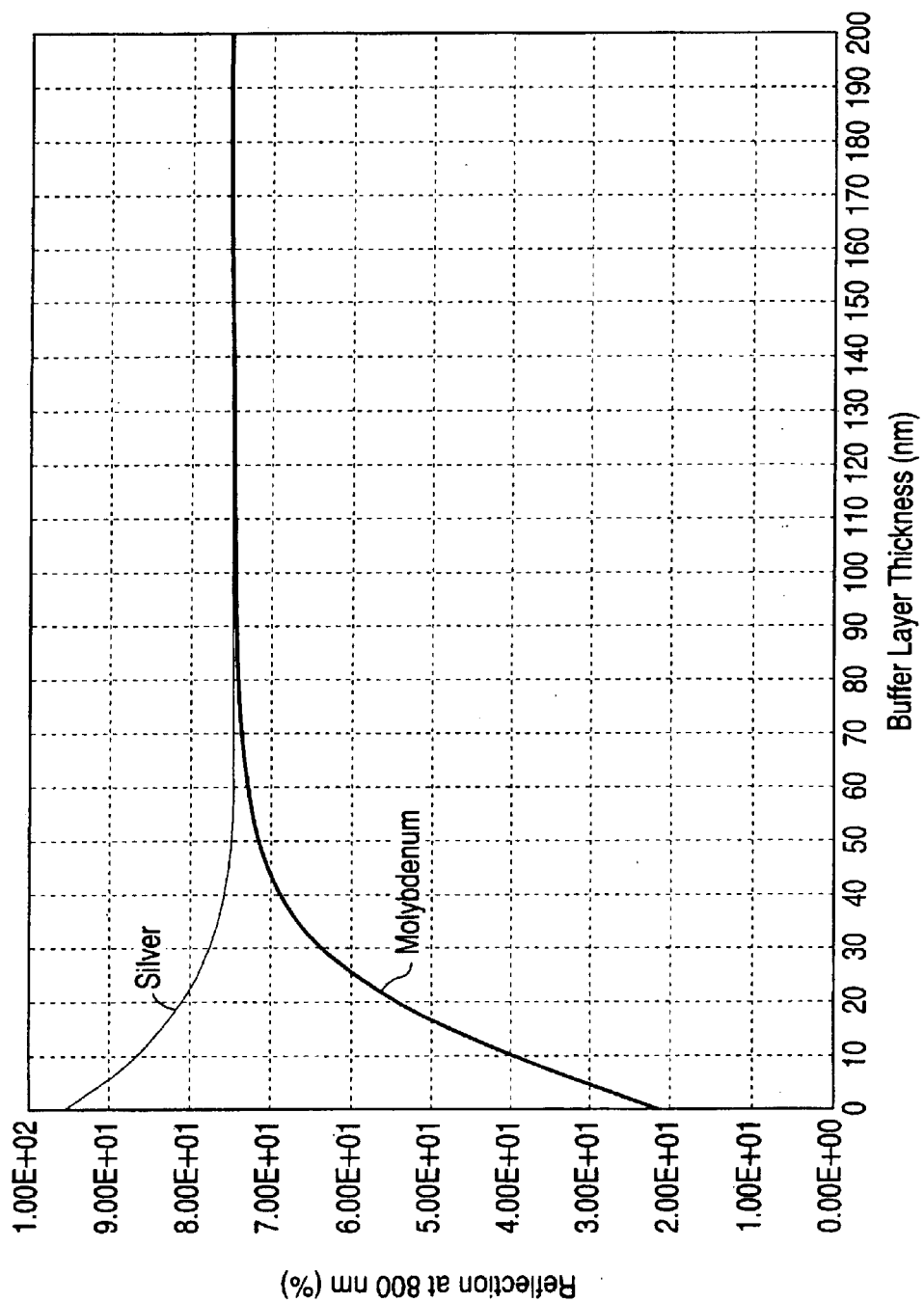
FIG. 5 shows the reflection at 800 nm at the absorber/reflector interface in a solar cell as a function of the thickness of a zirconium nitride barrier layer.
Figure 7:
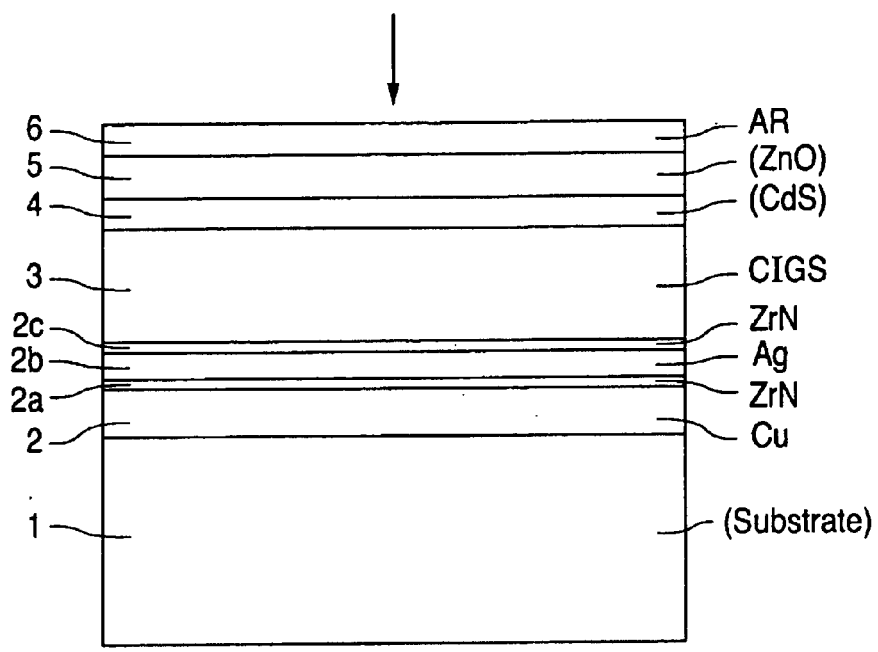
FIG. 7 shows an alternative structure for the solar cell of the present invention, wherein the back conducting/reflecting layer is improved with copper and silver layers.

An alternate embodiment of the solar cell of the present invention is shown in FIG. 7, where electrical contact layer 2 is made from copper instead of molybdenum. Copper is relatively inexpensive and a very good conductor. At about 0.2 microns thickness, it provides as much electrical conductivity as 0.5 microns of molybdenum. Layer 2a is a thin barrier layer of zirconium nitride that has a thickness in the range of approximately 10 to 20 nm. At this point the layer structure is the same as that discussed in FIG. 6, and it could be used in this form, especially with CIGS because of its modest band gap. However, the lower reflection shortward of about 600 nm (see FIG. 4) can be remedied by a thin layer 2b of silver (40 to 50 nm) deposited on top of the zirconium nitride layer, and an additional barrier layer 2c of zirconium nitride between the silver and the CIGS layers. With this structure the internal reflection at the silver/ZrN/CIGS interface is practically indistinguishable from the reflection curve labeled "silver" in FIG. 4, and the use of large amounts of the more expensive silver is avoided. If the CIGS processing temperature could be significantly lowered from the current value of about 550 C, then the intermediate barrier layer 2a between the copper and silver could be eliminated for temperatures below which copper and silver would rapidly inter-diffuse. Alternatively, for a low enough processing temperature aluminum could be substituted for both the copper and the silver. Of course, if the substrate were a metal foil instead of glass, the base metal layer could be made thinner while retaining the necessary reflectivity, since the metal foil would provide most of the conductivity.

The next layer to be described is the CIGS absorber. In this invention the preferred deposition method for the CIGS material is DC magnetron sputtering; however, AC reactive magnetron sputtering is also a viable alternative method diminished only by the added necessity of handling small amounts of the toxic gas hydrogen selenide. Both methods utilize the magnetron technology taught in '010 as the most desirable method; although, the invention may be practiced less effectively with conventional planar magnetrons. One reason DC magnetron sputtering has not been done with the CIGS material is that the electrical conductivity is too low because of its semiconductor nature. DC sputtering requires metal-like electrical conductivity as well as good thermal conductivity to allow high power for high deposition rates. Conceptually, one important idea in this invention is to divide the CIGS material into two parts, each part having properties that would permit the fabrication of a conductive sputtering target. For the majority of semiconductors that are serious candidates for use as absorber layers in solar cells this would be impossible, but the results of recent experiments demonstrate that it works for CIGS. After several failed attempts of various combinations, it was discovered that copper and selenium could be combined into a conductive matrix provided that the material was processed properly. A homogeneous mixture of powders consisting of approximately two parts Se and one part Cu remains highly conductive if it is cold pressed and annealed at a temperature somewhat below the melting point of Se (217° C.). Small samples made at 208 to 210° C. had good physical strength, and the electrical resistance was less than one ohm. When the annealing temperature is raised to about 400 C the resistance goes up by a factor of more than a million as might be expected from the formation of $CuSe_2$. But the conductive properties of the lower temperature material are not easily reconciled with the existing phase diagrams for the Cu—Se binary system. If chemical reactions between the Cu and Se do not occur at the low annealing temperature then the Se could be acting as a binder to hold a highly conductive copper matrix together. For this to be the case, the Cu would have to diffuse rapidly at the low annealing temperature, which is unlikely. The $Cu_2Se$ phase is the only Cu/Se phase known to be conductive, so it probably forms although it does not appear to be consistent with the phase diagram for this composition and temperature. However, since the material changes its appearance after annealing, it seems to favor a reaction having occurred. Similar experiments in which the Cu was replaced with In did not yield highly conductive matrices. In fact the resistance increased with indium content even at low annealing temperatures. Since In and Se have low melting points, the observed result might be expected, and unlike the Cu, it is consistent with the In—Se phase diagram.

Regardless of the inconsistency with the phase diagram, the Cu/Se has been made with the necessary properties for high rate DC magnetron sputtering. The target for the rest of the material must contain the indium and gallium needed to complete the CIGS structure. In and Ga are readily melted together to form a low temperature solder which can be poured or cast into a mold surrounding a backing or carrier tube to form the target. Good mixing and rapid quenching is required to prevent segregation and formation of the low temperature eutectic. A more desirable approach is to form the target by compressing metal powders, and in particular to include the gallium as gallium selenide ($Ga_2Se_3$). The target remains conductive and the low temperature eutectic is avoided. Additional Se may also be added and reacted with the In to form the insulating $In_2Se_3$ phase, but as long as enough free In is left to form a conductive matrix, the target will sputter adequately. About half of the In/Ga target can be Se, and remain conductive enough to sputter since it takes three atoms of Se for every two atoms of In or Ga. Replacing the gallium with aluminum raises the eutectic melting point substantially, without causing any further technical difficulties. The inclusion of selenium in the In/Ga or In/Al target in addition to the selenium from the copper target provides an overpressure of selenium during the deposition process that is highly desirable.

Another advantage this target construction technology offers is a way to dope the materials in many different and potentially beneficial ways. For example, it has been known for a long time that a very small amount of sodium (Na) added to the CIGS can improve its performance. Initially, it was noticed that cells made on soda lime glass had higher efficiency than those made on other substrates, particularly stainless steel. Later it was discovered that traces of Na from the glass were diffusing into the CIGS during deposition. However, a way to add a small but controlled amount of Na easily for non-glass substrates has proved difficult. With the target forming method of this invention it is easy to introduce trace amounts (e.g. about 0.1%) of $NaSe_2$ into either the Cu/Se or the In/Ga/Se to achieve the desired doping in the absorber layer.

The following description of sputtering CIGS material is made with respect to a pair of sputtering targets: one comprising of Cu and Se, and the other In, Ga, and Se. The ratio of Cu to Se is approximately 1 to 2, but may be varied to accommodate process variations and requirements. The In to Ga ratio is varied to change the band gap, and it can range from In alone (band gap of 1 ev) to about 30% Ga (band gap of 1.3 ev). It should be noted that changes in the ratios of the materials in each target as well as the additions of small levels of doping (as described above for Na) with other elements are considered to be consistent with the basic invention.

Figure 8:
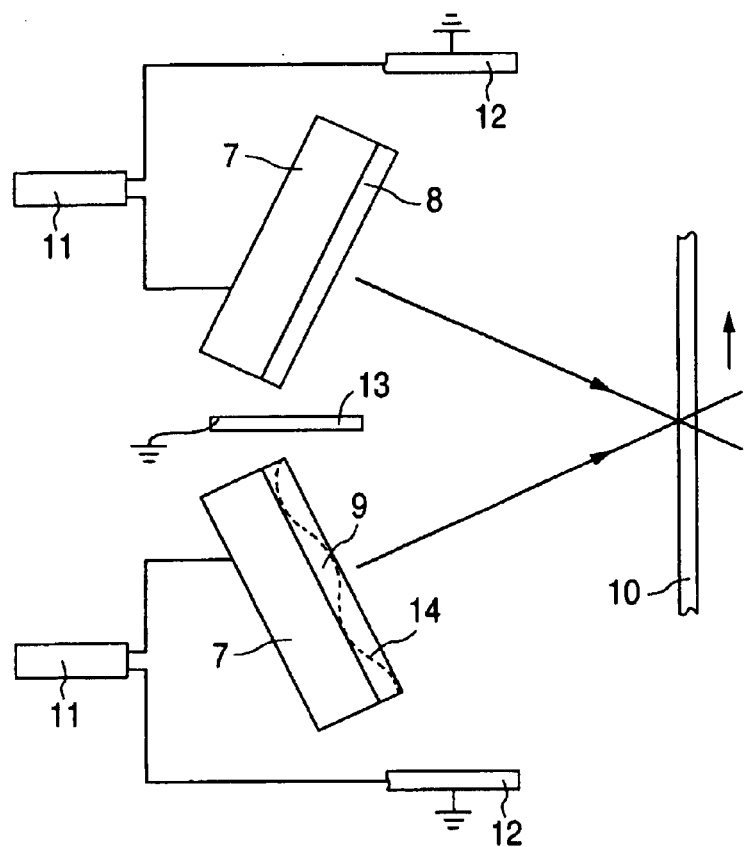
FIG. 8 shows schematically the co-sputtering of CIGS material from conventional dual rectangular planar magnetrons.

Conventional DC rectangular planar magnetron co-sputtering of the CIGS material is shown schematically in FIG. 8. The view is a cross-section taken perpendicular to the long axes of the magnetrons. Elements 7 represent the main bodies of the conventional magnetrons, which house the magnetic assemblies (not shown) that form the sputtering "racetrack" and the means of cooling targets 8 and 9. The magnetrons are oriented so that a line perpendicular to each target intersects at substrate 10, which is approximately 10 cm away. Each magnetron is powered by a DC power supply 11, which is grounded to chamber wall/shield 12 that serves as the system anode. Alternatively, separate anodes (not shown) intimately associated with each magnetron could be provided as is common in the art. Baffle 13 is placed between the magnetrons to help restrict material sputtered from one source from depositing on, and reacting with, that of the other source. The reacted material would be largely insulating and therefore undesirable since it builds up over time on areas of the planar target that are not sputtering. The baffle should not protrude toward the substrate so far that the flux reaching the substrate is significantly reduced. If grounded, as indicated, it could function as an anode or partial anode for each magnetron. All sputtering processes use a working gas, which is almost universally argon. Since it is inert, it may be introduced almost anywhere in the system. In FIGS. 8 through 12 the argon injection location is not shown explicitly; however, injection at the rear or sides of the magnetron is conventional and appropriate.

Still referring to FIG. 8, one of the targets, 8 for instance, comprises the conductive Cu/Se material, while target 9 comprises the conductive In/Ga/Se material. A substrate 10 is heated to a temperature of between 400 and 600 C, and is transported past the magnetrons at a uniform rate as indicated by the arrow. Argon is introduced as the working gas at a pressure of approximately 1 to 2 millitorr, and DC power is applied to sputter the materials. One power supply (11) is adjusted to achieve an acceptable sputtering rate for one of the two targets. The other power supply is then adjusted until the reacted coating on the heated substrate has the correct copper deficient composition. If the several constituents in each target have the same sputtering distribution pattern (although the two target patterns may differ from each other) then the correct composition will be achieved with power supply adjustments alone. In general this may not be the case, in part because the individual elements may have different sputtering patterns. Thus, one constituent may be preferentially collected on nearby shielding, shifting the coating composition slightly from that expected from the original target composition. Adjustments in the compositions of each target by only few percent will correct the discrepancy, but the exact composition is dependent on many factors including machine geometry, sputtering pressure and sputtering power, so the correct compositions must be worked out for each unique machine setup. Once the compositions are determined, they remain constant until there is a change in the process or system geometry. Such small variations in target composition to accommodate system geometry are considered to fall within the scope of this invention.

Process problems develop with the rectangular planar magnetron embodiment when the targets are sputtered for long periods of time, as would be the case for a large-scale manufacturing operation. A sputtering groove 14 (dashed line) gradually forms defining the "racetrack" on each target as the deposition process proceeds. The well-known cosine distribution, which describes the local flux emission pattern, is oriented perpendicular to the emitting surface. Therefore, the flux distribution at the substrate gradually changes as the target erodes and the groove forms. If the patterns from the two magnetrons do not change in synchronism with each other, the composition of the CIGS material deposited at the substrate will change with time, requiring adjustments to be determined and applied to the process almost continuously.

A second problem is that baffle 13 will not totally stop flux mixing between the targets over extended run times. This means that eventually significant amounts of partially insulating reaction products will build up on regions of the targets that are not being sputtered (i.e. at the edges of the "racetrack"). This can lead to arcing and defects in the CIGS film. Finally, the utilization of the target material ranges from about 25 to 40% for the planar targets, and they must be changed often, thus raising the manufacturing costs.

Figure 9:
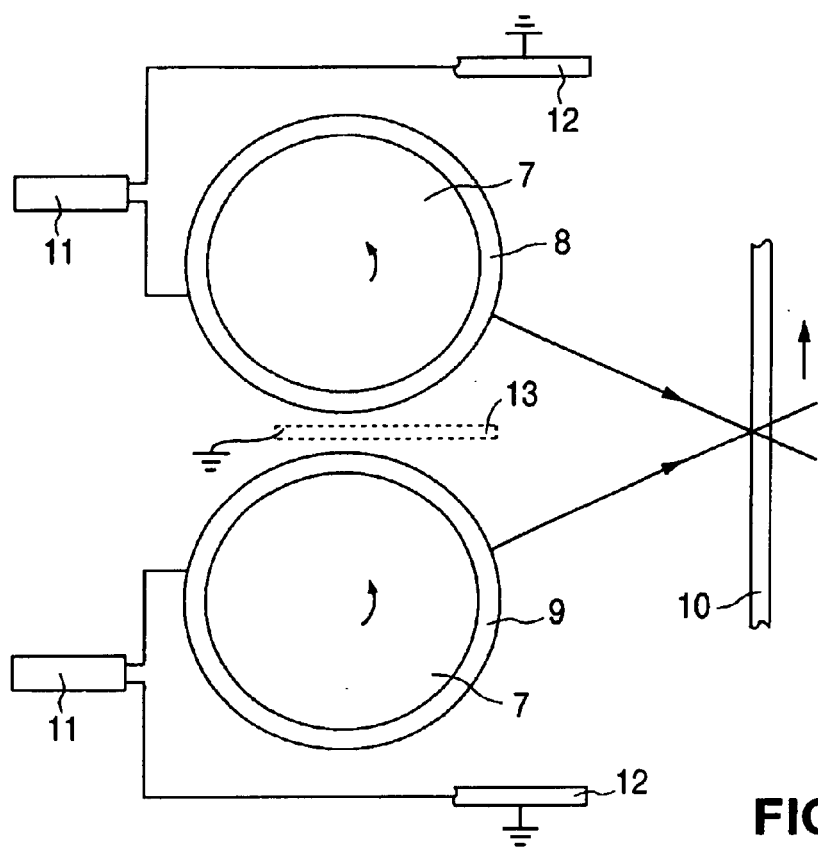
FIG. 9 illustrates schematically the preferred embodiment of the DC co-sputtering of CIGS material from dual cylindrical rotary magnetrons.

If cylindrical rotary magnetrons are substituted for the planar magnetrons in FIG. 8, the setup becomes that shown in FIG. 9, where common and similar elements are labeled with the same numerals. If they are operated identically to that of the planar magnetron setup, the problems associated with the planar magnetron embodiment are largely eliminated. Since they rotate, a sputtering groove never forms. So the composition of the coating remains constant as the target material is consumed, because the emission pattern of the flux remains fixed. Also, because of the rotation and subsequent continual target cleaning, there can be no long term increasing build up of reacted material on the targets for the same reasons that pertain to reactive sputtering as detailed in '010. For this reason baffle 13 (shown dashed) is not as important in the rotary magnetron embodiment. If the diameter of the rotary target is equal to the planar target width, and the target material is the same thickness, then the rotary target has over three times the initial inventory of material as the planar. And, because the utilization is more than double that of the planar, the rotary targets will run more than six times as long as the planar targets before target changes are necessary. This is a significant cost saving factor for large-scale manufacturing.

Figure 10:
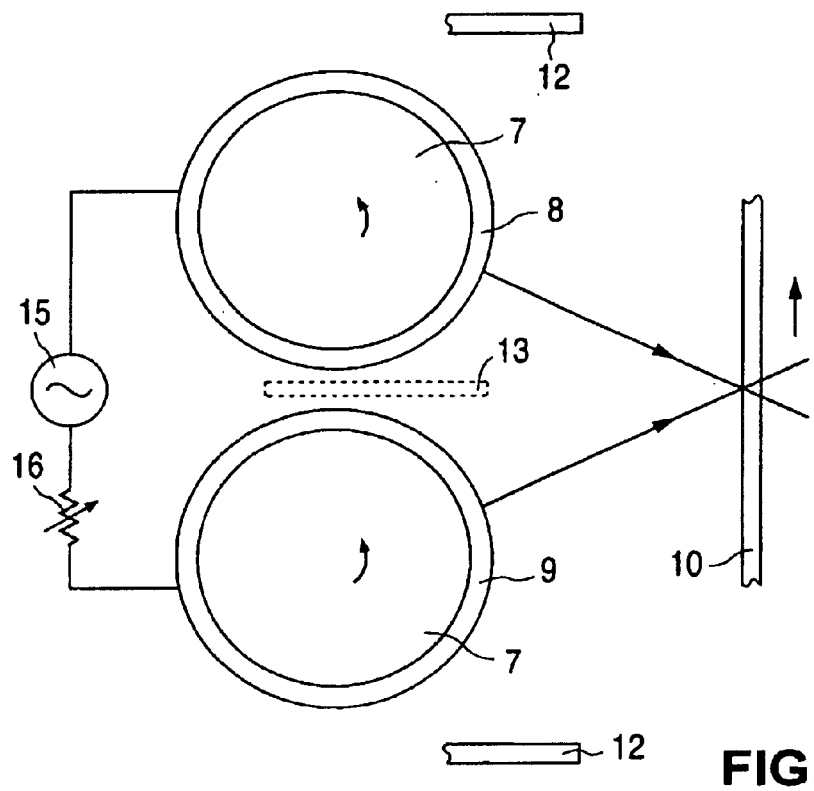
FIG. 10 shows schematically an alternative method of using AC power to co-sputter the CIGS material.

Either the planar or the rotary magnetrons could be run in AC mode. This is illustrated in FIG. 10 for the rotary magnetrons, but the setup would apply as well to the planar magnetrons. The two DC power supplies 11 are replaced by a single AC power supply 15. In order to vary the deposition rates between the targets to maintain a copper deficient film composition, a variable impedance load 16 must be inserted into one of the legs of the AC supply. Since AC operation with dual magnetrons does not require a separate anode, the chamber wall/shields 12 no longer need to be grounded and neither does baffle 13. This alternative setup using AC power when the conductive targets will support DC operation offers little advantage for the rotary magnetrons, but since the planar magnetrons are not self-cleaning, it could offer some protection from arcing in that setup.

Figure 11:
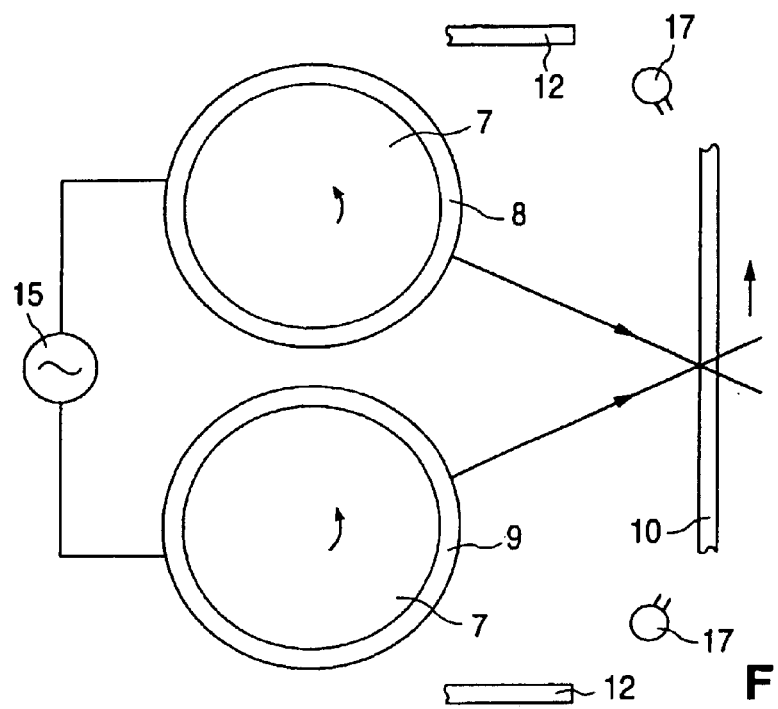
FIG. 11 shows schematically an alternative AC reactive sputtering method using dual cylindrical rotary magnetrons with identical metal alloy targets to form the CIGS material.

As mentioned above AC reactive sputtering of the CIGS material is a viable alternative to DC sputtering if facility arrangements are made to handle small amounts of hydrogen selenide gas, or other potentially useful gases. FIG. 11 shows this setup for a pair of rotary magnetrons. It differs from that shown in FIG. 10 in a number of respects.

First, targets 8 and 9 are now identical, consisting of an alloy of the metals copper, indium, and gallium (or aluminum) selected to give a slightly copper deficient composition and a desired band gap. Basically the atomic ratio of copper to indium plus gallium or aluminum should be slightly less than one, with the ratio of indium to gallium or aluminum determining the band gap. The metal targets can be made using conventional melting and casting techniques. Since the targets are now identical in composition, baffle 13 may also be eliminated. In addition to using argon as the conventional sputtering gas, hydrogen selenide gas is fed into the system near the substrate through, for example, nozzles 17 to react with the sputtered metal atoms and form the CIGS material in a continuous process.

To date the best candidates for high efficiency thin-film solar absorbers contain materials that must be made in complex structures, or that form or use compounds and gases that are toxic. At the present time there is one class of materials that show some promise for changing this situation, and those are the nitrides of the IIIA elements aluminum, gallium, and indium. The nitrides of various mixtures of In/Ga and In/Al display a range of band gaps that span the range of the solar spectrum. So far the techniques for making them as p-type semiconductors have not been perfected. Such an absorber system would be ideal for production with the rotary magnetrons of '010. The setup would be like that shown in FIG. 11 except the toxic reactive gas hydrogen selenide would be replaced with harmless nitrogen. The transition metal nitride layer (i.e. ZrN) previously discussed is formed precisely in this way.

Since the CIGS layer (or other absorber layer) is relatively thick, the throughput of the sputtering machine can be improved by using two or more pairs of magnetrons to deposit the layer. Because the cost of the magnetrons is moderate compared to the overall cost of the vacuum system, the increased production rates more than offset the moderate increase in the initial capital costs. For an in-line machine that coats discrete substrates, throughput can also be increased by placing magnetron sources on both sides of the machine, and coating two substrates on the same pass. The need to use multiple pairs of magnetrons to increase the rate of deposition of the CIGS layer presents another opportunity that is exploited in the present invention. This is discussed below using a representative example.

Figure 12:
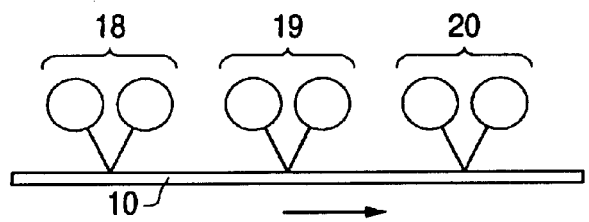
FIG. 12 illustrates schematically the use of three sets of dual magnetrons to increase the deposition rate and grade the composition of the CIGS layer to vary its band gap.

FIG. 12 illustrates schematically the CIGS deposition region within a sputtering machine equipped with three pairs of rotary (shown) or planar (not shown) magnetrons. It could represent a region from an in-line machine, or if arranged in an arc, a region from a roll-to-roll coater with a web substrate carried on a drum. With respect to the direction of motion of substrate 10 (indicated by the arrow), the first pair of magnetrons is 18, the second 19, and the third 20. In each pair of magnetrons, one of the targets is Cu/Se with a properly adjusted composition as discussed above. However, the second target in each group would be, for example, just In/Se for 18, In/Se with 15% Ga for 19, and In/Se with 30% Ga for 20. In this way the Ga content of the CIGS layer would be step-wise graded from bottom to top with little or no Ga in the bottom region and some maximum amount of Ga in the top region. This will grade the band gap from about 1 ev at the bottom to about 1.3 ev near the top of the layer. Inverting the target sequence or coating in the reverse direction would invert the band gap grading. Some smoothing of the stepped boundary could be obtained by placing the magnetrons close enough together to allow some overlap in their deposition patterns; however, thermal diffusion of the material will cause some grading at the interface between regions in any event.

The advantage of being able to adjust the CIGS composition easily by using multiple sets of targets is that the band gap of the CIGS can be engineered to optimize the efficiency of the cell. Conventional wisdom would suggest forming the highest band gap regions at the top layer and the lowest band gap regions at the bottom in the same order as that used in multi-junction cells. However, in practice inverting this structure in a single junction cell generally leads to improved efficiency through a broadening of the voltage gradient across the absorber. Without Ga (or Al) in the CIGS the band gap is about 1 electron volt (ev), while the optimum for the solar spectrum is about 1.4 to 1.5 ev. Replacing In with 30% Ga raises the band gap to about 1.2 ev. Further additions of Ga start to lower cell efficiency. If Ga totally replaces In, the band gap can exceed 1.6 ev. Aluminum raises the band gap faster than Ga, allowing a bandgap of 1.45 without exceeding 30%. Sulfur replacement of some of the selenium also raises the band gap, but less effectively than Ga. Many combinations are possible, and for a wide range of additive materials the targets, when fabricated as described herein, remain conductive enough to co-sputter by DC methods. If p-type nitrides can be perfected, the magnetron targets would be fabricated with varying ratios of In/Ga and In/Al to achieve similar graded band gaps, and it could be accomplished by standard reactive AC sputtering with nitrogen as described in '010.

The conventional plated CdS n-type window or buffer layer is not used because of the toxicity and waste disposal problems associated with cadmium. A substitute material that has been shown to work about as well is ZnS, as previously noted. This material can readily be made in the present invention by AC reactive sputtering from elemental zinc targets used in the setup described in FIG. 11. In this case the reactive gas that is injected through nozzles 17 is hydrogen sulfide instead of hydrogen selenide. Since hydrogen sulfide is also a dangerous gas, it is not the method of choice for depositing the layer. Since the layer is very thin, it can be RF sputtered without negatively impacting the manufacturing rate. However, as stated before, conventional RF sputtering presents challenges in large-scale because of the non-uniformity associated with variable machine geometry. The method of RF sputtering described below will overcome the objection presented by variable geometry. ZnSe could be RF sputtered using the same RF technique, but it is less desirable than ZnS because its band gap is smaller, although both materials have larger band gaps than CdS.

Since most transparent conducting oxides are n-type semiconductors, it is somewhat of a mystery that the conventional ZnO, being an n-type semiconductor, cannot also be used as the window layer to make the p-n junction. All previous attempts to do this have failed to yield a cell with high efficiency unless a plated CdS "buffer" layer is placed in between the absorber and the ZnO. Some studies have pointed to the formation of gallium oxide at the interface as being at least part of the problem, although indium oxide and selenium oxide could form as well. Oxidation damage to the interface can be caused by energetic negative oxygen ions from the sputtering plasma bombarding the CIGS surface during the initial growth phase of the ZnO overcoat. Also, the energetic ions may cause physical damage to the interface.

This interface damage to the p-n junction may be minimized or eliminated with the use of a very thin sacrificial layer of a pure metal placed over the CIGS layer before the transparent conductive overcoat is applied. It is well known that zinc, cadmium, and mercury doping will change CIGS from p to n-type, but only zinc is substantially free of toxicity and waste disposal problems. If a thin layer of zinc is used, it can serve a dual role. First, it can diffuse into the CIGS layer doping it to n-type, and therefore move the p-n junction away from the interface forming a homojunction. Secondly, it can "take the brunt" of the negative ion bombardment converting to ZnO or ZnS in the process, thus reducing or eliminating damage to the CIGS interface. Damage to the interface is not necessarily limited to high-energy oxygen ions. Both sulfur and selenium form high-energy ions in a sputtering plasma in a manner similar to oxygen. Metals other than zinc might be used; however, they would form p-n heterojunctions. For example, thin layers of some of the transition metals would protect the CIGS from oxidation, but would not move the p-n junction by diffusion into the CIGS. In particular zirconium will be converted to zirconium oxide, which is also an n-type semiconductor, and it is one of the alternative materials mentioned by Ullal, Zweibel, and von Roedern.

The use of a sacrificial layer as just described can help protect the p-n junction and maintain a higher voltage across the depletion region. It is useful because highly conductive ZnO will not support hole stability as well as a less conductive n-type interface material. For this reason it has become common practice to use what is called "intrinsic" ZnO or i-ZnO as an initial thin overcoat for the CdS to help maintain the depletion zone in regions where the chemical bath plated CdS is marginal. This form of ZnO is made by adding more oxygen to the process to make a less conductive and more transparent form of the material. Of course the use of i-ZnO alone is damaging to the interface because of the energetic oxygen ions. Therefore sacrificial metallic layers can substitute for the conventional plated CdS as long as the oxide that is produced is an n-type semiconductor.

After the n-type layer is properly formed to create the p-n junction, the top transparent electrode layer is deposited. A transparent and conductive form of ZnO has been the conventional material used for this layer, largely because it is less costly compared to materials like indium tin oxide (ITO) that is widely used in the display industry. ZnO is both less conductive and less thermally stable than ITO; however, ZnO doped with aluminum has the approximate performance of ITO while retaining much of the cost advantage of ZnO. The required level of aluminum doping to achieve this result is about 2 percent. Similar amounts of other dopants have been shown to work almost as well (see "New n-Type Transparent Conduction Oxides" by T. Minami in MRS Bulletin, August 2000). Currently, large scale sputtering of the ITO in the display industry is accomplished primarily by using planar ceramic targets, which are conductive but expensive to fabricate. Control of the reactive process in large scale when metallic targets are used has met with little success. A similar problem exists with the large-scale control of the reactive process for depositing aluminum doped ZnO. In principle this problem can be solved by using ceramic targets as is done with the ITO, but the extra cost for the target fabrication offsets much of the advantage gained from the cheaper materials. In this invention the rotary magnetrons as described in '010 allow the use of the cheaper metallic targets, and provide the necessary control of the reactive process for large-scale implementation. The reactive sputtering setup is identical to that described in FIG. 11 where targets 8 and 9 are both metallic zinc targets with the appropriate doping of aluminum. In addition to the usual argon sputtering gas, oxygen is supplied to the deposition region through nozzles 17.

Figure 13:
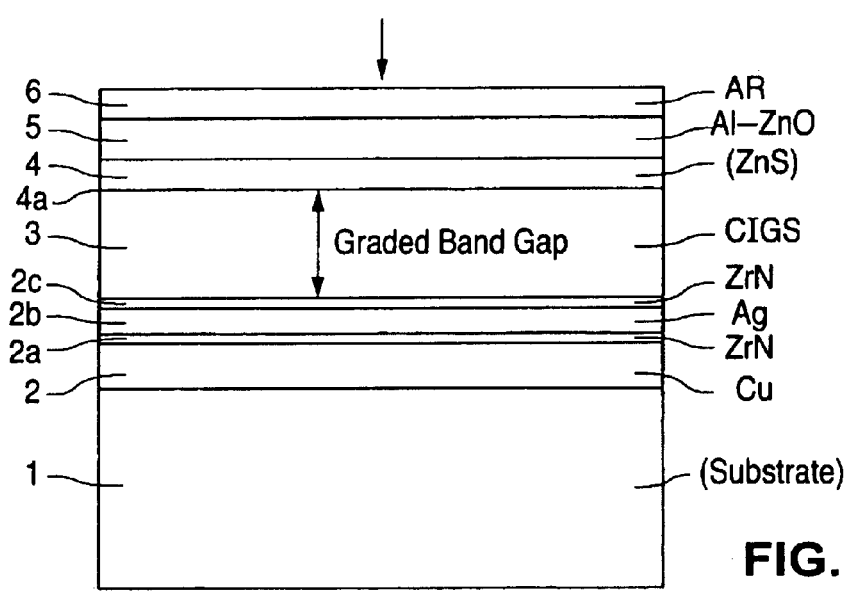
FIG. 13 shows the structure of a preferred embodiment of an improved all sputtered version of the basic solar cell of the present invention.

FIG. 13 shows the preferred all sputtered CIGS solar cell structure of the present invention. Layer 1 (the substrate) is a high temperature metal or polymer foil. Stainless steel, copper, and aluminum are the preferred metal foils for terrestrial power production, while very thin titanium and polyimide are preferred foils for space power applications. Electrically conductive layers 2, 2a, 2b, and 2c are Cu, ZrN, Ag and ZrN, respectively, as previously described in FIG. 7. The CIGS in layer 3 has a graded band gap created by changes in the composition of successive targets as shown and described in FIG. 12. The method of deposition may be either the DC co-sputtered film described in FIG. 9 or the reactively sputtered film described in FIG. 11. Semiconductor layer 4 is RF sputtered ZnS (or ZnSe) replacing the CdS of the conventional cell. As an additional feature, layer 4a may be included as a sacrificial metal layer that becomes an n-type semiconductor upon subsequent reaction during the deposition of the next layer (i.e. with oxygen, sulfur, or selenium). Layer 5 is the transparent top electrode and comprises of reactively deposited aluminum doped ZnO to take advantage of the improvement in performance over the conventional ZnO. As previously explained, a very thin portion of the aluminum doped ZnO at the layer 4 interface may have a higher resistivity to improve the junction voltage. Layer 6 is the optional anti-reflection (AR) film and is actually a multi-layer stack (not shown) designed to optimize the light absorption in the cell. Such an AR stack would be used in a space power application where environmental degradation from weather is not an issue. For terrestrial applications the basic cells (layers 1 through 5) are laminated to a protective glass cover sheet in a sealed module (not shown), and the AR layer, if used, is applied to the outer surface of the glass cover instead of directly to the cell. One might additionally sputter current collection grid lines on the top conducting oxide, and if the substrate is a metal foil, a thin solder wetting layer (tin for example) may be sputtered on the back.

Figure 14:
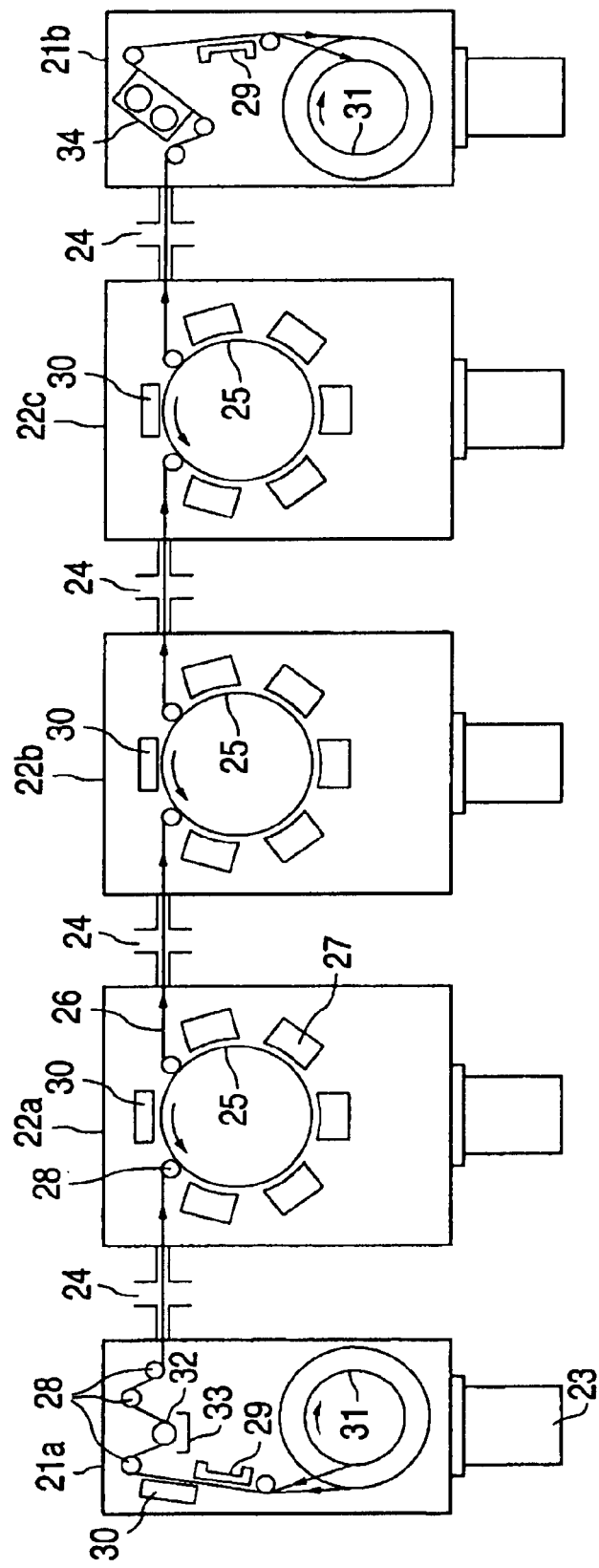
FIG. 14 shows a highly simplified schematic diagram of the side view of a roll-to-roll modular sputtering machine used to manufacture the solar cell depicted in FIG. 13.

A simplified schematic side view of a roll-to-roll modular sputtering machine for making the improved solar cell of FIG. 13 is illustrated in FIG. 14. In the direction perpendicular to the view plane the machine is sized to support substrates between about two and four feet wide. This width is not a fundamental equipment limit; rather, it recognizes the practical difficulty of obtaining quality substrate material in wider rolls. The machine is equipped with an input, or load, module 21a and a symmetrical output, or unload, module 21b. Between the input and output modules are process modules 22a, 22b, and 22c. The number of process modules may be varied to match the requirements of the coating that is being produced. Each module has a means of pumping to provide the required vacuum and to handle the flow of process gases during the coating operation. The vacuum pumps are indicated schematically by elements 23 on the bottom of each module. A real module could have a number of pumps placed at other locations selected to provide optimum pumping of process gases. High throughput turbomolecular pumps are preferred for this application. The modules are connected together at slit valves 24, which contain very narrow low conductance isolation slots to prevent process gases from mixing between modules. These slots may be separately pumped if required to increase the isolation even further. Alternatively, a single large chamber may be internally segregated to effectively provide the module regions, but it then becomes much harder to add a module at a later time if process evolution requires it.

Each process module is equipped with a rotating coating drum 25 on which web substrate 26 is supported. Arrayed around each coating drum is a set of dual cylindrical rotary magnetron housings 27. Conventional planar magnetrons could be substituted for the dual cylindrical rotary magnetrons; however, efficiency would be reduced and the process would not be as stable over long run times. The coating drum may be sized larger or smaller to accommodate a different number of magnetrons than the five illustrated in the drawing. Web substrate 26 is managed throughout the machine by rollers 28. More guide rollers may be used in a real machine. Those shown here are the minimum needed to present a coherent explanation of the process. In an actual machine some rollers are bowed to spread the web, some move to provide web steering, some provide web tension feedback to servo controllers, and others are mere idlers to run the web in desired positions. The input/output spools and the coating drums are actively driven and controlled by feedback signals to keep the web in constant tension throughout the machine. In addition, the input and output modules each contain a web splicing region 29 where the web can be cut and spliced to a leader or trailer section to facilitate loading and unloading of the roll. Heater arrays 30 are placed in locations where necessary to provide web heating depending upon process requirements. These heaters are a matrix of high temperature quartz lamps laid out across the width of the coating drum (and web). Infrared sensors provide a feedback signal to servo the lamp power and provide uniform heating across the drum. In addition coating drums 25 are equipped with an internal controllable flow of water or other fluid to provide web temperature regulation.

The input module accommodates the web substrate on a large spool 31, which is appropriate for metal foils (stainless steel, copper, etc.) to prevent the material from taking a set during storage. The output module contains a similar spool to take up the web. The pre-cleaned substrate web first passes by heater array 30 in module 21a, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Another roller/magnetron may be added (not shown) to clean the back surface of the web if required. Direct sputter cleaning of a conductive web will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into the large roll coater. Also, a corona glow discharge treatment could be performed at this position without introducing an electrical bias. If the web is polyimide material electrical biases are not passed downstream through the system. However, polyimide contains excessive amounts of water. For adhesion purposes and to limit the water desorption, a thin layer of metal (typically chromium or titanium) is routinely added. This makes the surface conductive with similar issues encountered with the metallic foil substrates.

Next the web passes into the first process module 22a through valve 24 and the low conductance isolation slots. The coating drum is maintained at an appropriate process temperature by heater array 30. Following the direction of drum rotation (arrow) the full stack of reflection layers begins with the first two magnetrons depositing the base copper layer (2 in FIG. 13). The next magnetron provides a thin ZrN layer, followed by the thin silver layer and the final thin ZrN layer. For a CIGS absorber layer the band gap is low enough that little is gained by the thin silver and final thin ZrN layer. In this case the reflector may consist of just the base copper layer and the first ZrN layer. Future higher band gap materials could benefit from the extra silver and ZrN layers.

The web then passes into the next process module, 22b, for deposition of the p-type graded CIGS layer. Heater array 30 maintains the drum and web at the required process temperature. The first magnetron deposits a layer of copper indium diselenide while the next three magnetrons put down layers with increasing amounts of gallium (or aluminum), thus increasing and grading the band gap as previously described. The grading may be inverted by rearrangement of the same set of magnetrons. The last magnetron in the module deposits a thin layer of n-type ZnS (or ZnSe) by RF sputtering from a planar magnetron, or a sacrificial metallic layer, which becomes part of the top n-type layer and defines the p-n junction.

Next the web is transferred into the final process module, 22c, where again heater array 30 maintains the appropriate process temperature. The first magnetron deposits a thin layer of aluminum doped ZnO which has a higher resistance to form and maintain the p-n junction in coordination with the previous layer. The remaining four magnetrons deposit a relatively thick, highly conductive and transparent aluminum doped ZnO layer that completes the top electrode. Extra magnetron stations (not shown) could be added for sputtering grid lines using an endless belt mask rotating around the magnetrons. If an AR layer is to be placed on top of the cell, the machine would have an additional process module(s) in which the appropriate layer stack would be deposited. The extra modules could also be equipped with moving, roll compatible, masking templates to provide a metallic grid and bus bar for making electrical contact to the top electrode. The extra modules and masking equipment adds significantly to the cost of producing the cell, and may only be justified for high value added applications like space power systems.

Finally, the web passes into output module 21b, where it is wound onto the take up spool. However, an additional operation can be performed here, which is beneficial in the later processing of the cells into modules. A dual cylindrical rotary magnetron 34 becomes the means to pre-wet the back of the substrate foil with solder. Metallic tin probably has the best properties of the available solder materials for use with a stainless steel foil, but there are many solder formulations that will work. Pre-wetting may be unnecessary for a copper foil if it is kept clean. An ion gun sputter pre-cleaning of the back surface of the foil before the. solder sputtering may also be done in the output module similar to that in the input module. In addition the web temperature must be below the melting point of the pre-wetting solder (about 232 C for tin).

Figure 15:
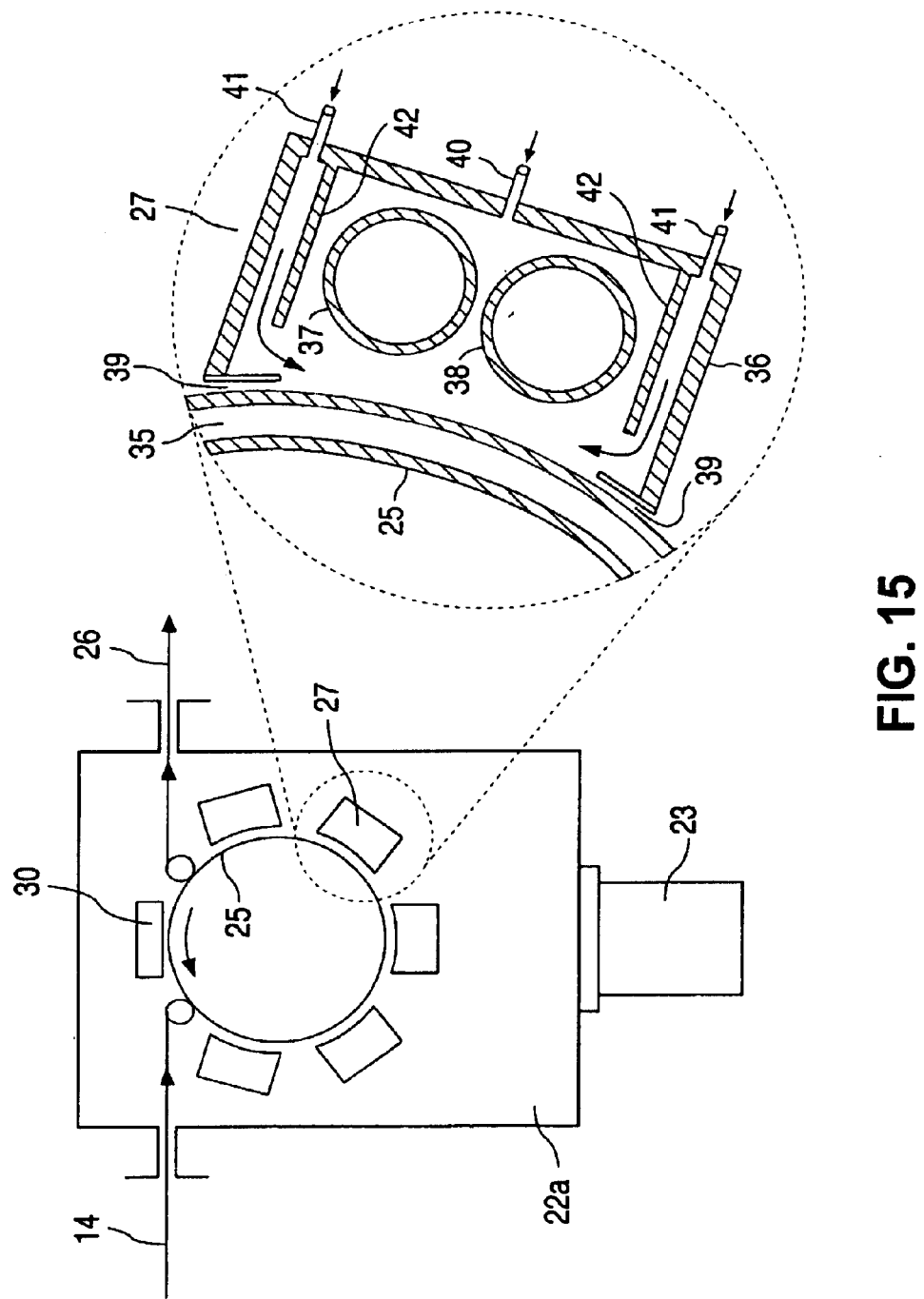
FIG. 15 shows a more detailed schematic diagram of a section of a process module with details of the construction of the coating drum and the magnetron.

FIG. 15 shows a typical process module with an expanded section revealing details of coating drum 25 and magnetron housing 27. The coating drum is constructed with a double wall defining a gap 35 through which a cooling gas or liquid may be circulated to regulate the temperature of the drum and web 26. The web is maintained in tight contact against the outer surface of the drum. Magnetron housing 27 consists of a local rectangular chamber 36 that contains rotary magnetrons 37 and 38 and the associated mounting hardware (not shown). The entire housing can be located at a variable but uniform distance, represented by gap 39, from the surface of the coating drum and web. This variable gap allows control of the flow of the sputtering gases from chamber 36 into the larger process module 22a, which is vigorously pumped. Thus a large pressure differential is maintained between the background pressure in rectangular chamber 36 and the process module (22a), and each magnetron is effectively isolated from its neighbors. Argon sputtering gas, indicated by the arrow, is fed into chamber 36 through a set of tubes 40 which are spaced uniformly along its length. For reactive sputtering, the reactive gas (e.g. oxygen, nitrogen, hydrogen sulfide, hydrogen selenide, etc.) is fed into chamber 36 through two sets of tubes 41, each set being equally spaced along its length. Internal baffles 42 create corridors which direct the reactive gas to the substrate, yet prevent coating flux from changing the conductance path of the gas with time, insuring a steady state process. This setup closely resembles that disclosed by Chahroudi in U.S. Pat. No. 4,298,444 issued Nov. 3, 1981, and is incorporated herein by reference. Rectangular chamber 36 has been referred to as a "mini" chamber within the larger vacuum chamber. The major improvements are that dual cylindrical rotary magnetrons are substituted for the single rectangular magnetron of the prior art, and the method of injection of the sputtering gases has been improved.

Rectangular "mini" chamber 36 provides the key to the use of RF sputtering for the deposition of the ZnS (or ZnSe) buffer layer from a single planar magnetron, as opposed to the rotary magnetrons that are illustrated. This chamber forms an isolated geometrically uniform structure that in turn provides a uniform electrical environment for the RF sputtering. This allows the RF sputtering to proceed uniformly along the length of the magnetron. In addition, the chamber is protected from contamination from the other neighboring sputtering sources, so that minor back sputtering from the chamber walls consists only of the ZnS material. Thus the ZnS n-type layer is protected from extraneous doping by foreign contaminants.

It is to be understood that the present invention is not limited to the embodiment(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. A solar cell, comprising:
   a substrate;
   a conductive film disposed on a surface of the substrate, wherein the conductive film includes a plurality of discrete layers of conductive materials, wherein the discrete layers of conductive materials include:
      at least one metallic layer of material selected from one or more groups comprising copper, silver, aluminum, molybdenum, and niobium; and
      at least one barrier layer made substantially of a transition metal nitride material;
   at least one p-type semiconductor absorber layer disposed on the conductive film, wherein the p-type semiconductor absorber layer includes a copper indium diselenide (CIS) based alloy material;
   an n-type semiconductor layer disposed on the p-type semiconductor absorber layer, wherein the p-type semiconductor absorber layer and the n-type semiconductor layer form a p-n junction; and
   a transparent electrically conductive top contact layer on the n-type semiconductor layer.

2. The solar cell of claim 1, wherein the transition metal nitride material is selected from one or more groups comprising titanium nitride, zirconium nitride, and hafnium nitride.

3. The solar cell of claim 1, wherein the barrier layer comprises substantially of zirconium nitride.

4. The solar cell of claim 1, wherein the discrete layers of conductive materials include:
   a plurality of metallic layers of material each selected from one or more groups comprising copper, silver, aluminum, molybdenum, and niobium; and
   a plurality of barrier layers each of a transition metal nitride material.

5. The solar cell of claim 4, wherein the barrier layers are each selected from one or more groups comprising titanium nitride, zirconium nitride, and hafnium nitride.

6. The solar cell of claim 4, wherein the barrier layers each comprises zirconium nitride.

7. The solar cell of claim 1, wherein the substrate comprises thin metallic foil.

8. The solar cell of claim 7, wherein the thin metallic foil is selected from one or more groups comprising stainless steel, copper, and aluminum.

9. The solar cell of claim 1, wherein the p-type semiconductor absorber layer has a graded bandgap.

10. A solar cell, comprising:
   a substrate;
   a conductive film disposed on a surface of the substrate, wherein the conductive film includes a plurality of discrete layers of conductive materials, wherein the discrete layers of conductive materials include:
      a first layer of copper;
      a second layer of silver; and
      a plurality of barrier layers each a transition metal nitride material;
   at least one p-type semiconductor absorber layer disposed on the conductive film, wherein the p-type semiconductor absorber layer includes a copper indium diselenide (CIS) based alloy material;
   an n-type semiconductor layer disposed on the p-type semiconductor absorber layer, wherein the p-type semiconductor absorber layer and the n-type semiconductor layer form a p-n junction; and
   a transparent electrically conductive top contact layer on the n-type semiconductor layer.

11. A solar cell comprising:
   a substrate;
   a conductive film disposed on a surface of the substrate, wherein the conductive film includes a plurality of discrete layers of conductive materials;
   at least one p-type semiconductor absorber layer disposed on the conductive film, wherein the p-type semiconductor absorber layer includes a copper indium diselenide (CIS) based alloy material;
   an n-type semiconductor layer disposed on the p-type semiconductor absorber layer, wherein the p-type semiconductor absorber layer and the n-type semiconductor layer form a p-n junction;
   a transparent electrically conductive top contact layer on the n-type semiconductor layer, and
   a layer of metallic material disposed between the p-type semiconductor absorber layer and the n-type semiconductor layer.

12. The solar cell of claim 11, wherein the layer of metallic material comprises zinc.

* * * * *